(12) United States Patent
Tottori

(10) Patent No.: US 6,368,956 B2
(45) Date of Patent: *Apr. 9, 2002

(54) METHOD OF MANUFACTURING A SEMICONDUCTOR DEVICE

(75) Inventor: Isao Tottori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/780,461

(22) Filed: Feb. 12, 2001

Related U.S. Application Data

(63) Continuation of application No. 09/198,363, filed on Nov. 24, 1998, now Pat. No. 6,207,987.

(30) Foreign Application Priority Data

Jun. 3, 1998 (JP) .............................. 10-154384

(51) Int. Cl.[7] .......................................... H01L 21/4763
(52) U.S. Cl. ...................... 438/633; 438/626; 438/645; 438/646
(58) Field of Search .................. 438/626, 631, 438/632, 633, 645, 646, 692, 760

(56) References Cited

U.S. PATENT DOCUMENTS

| 5,550,076 A | | 8/1996 | Chen .............................. 437/52 |
| 5,717,236 A | | 2/1998 | Shinkawata .................. 257/306 |
| 5,759,906 A | * | 6/1998 | Lou ............................. 438/623 |
| 5,792,707 A | * | 8/1998 | Chung .......................... 438/633 |
| 5,936,272 A | | 8/1999 | Lee ............................... 257/306 |
| 6,037,250 A | * | 3/2000 | Matsubara ................... 438/622 |
| 6,207,987 B1 | * | 3/2001 | Tottori ......................... 257/306 |

FOREIGN PATENT DOCUMENTS

| JP | 8-51108 | 2/1996 |
| JP | 09-036229 | 2/1997 |
| JP | 09/162144 | 6/1997 |

* cited by examiner

Primary Examiner—Alexander G. Ghyka
(74) Attorney, Agent, or Firm—McDermott, Will & Emery

(57) ABSTRACT

On a silicon oxide film covering a gate electrode portion, a reflowed and polished BPSG film is formed. A second interconnection layer is formed on the BPSG film. To cover the second interconnection layer, a silicon oxide film having a thickness of at least the substantial thickness of the second interconnection layer is formed on a silicon oxide film. Thus, the planarity of the base of the interconnection layer is ensured and displacement of the interconnection layer is suppressed. Accordingly, a semiconductor device having a high degree of integration is obtained.

7 Claims, 27 Drawing Sheets

METHOD OF MANUFACTURING A SEMICONDUCTOR DEVICE

This application is a Continuation of application Ser No. 09/198,363 filed Nov. 24, 1998, now U.S. Pat. No. 6,207, 987.

BACKGROUND OF THE INVENTION

1. Field of the Invention

The present invention relates to a semiconductor device and more specifically to a semiconductor device ensuring the planarity of an interlayer insulating film and preventing displacement of an interconnection thereby achieving a high degree of integration.

2. Description of the Background Art

As one example of conventional semiconductor devices, a semiconductor device including an MOS transistor will be described with reference to the drawings. Referring to FIG. 47, a plurality of gate electrode portions 55 including a polycrystalline silicon film 55a, a tungsten silicide film 55b and a silicon oxide film 55c are formed on the surface of a silicon semiconductor substrate 51 with a gate insulating film 54 interposed therebetween. A pair of impurity diffusion layers 56a, 56b are formed at the surface of silicon semiconductor substrate 51 with one gate electrode portion 55 sandwiched therebetween. A pair of impurity diffusion layers 56c, 56d are formed at the surface of silicon semiconductor substrate 51 with another gate electrode portion 55 sandwiched therebetween. A sidewall insulating film 57 is formed on the both side surfaces of gate electrode portion 55. Gate electrode portion 55 and a pair of impurity diffusion layers 56a, 56b constitute one MOS transistor. Further, gate electrode portion 55 and a pair of impurity diffusion layers 56c, 56d constitute another MOS transistor. Gate electrode portion 55 of each MOS transistor serves as a first interconnection layer. MOS transistors are electrically insulated from one another by a separating oxide film 53 that is formed in an element separating trench 52 at the surface of silicon semiconductor substrate 51.

A silicon oxide film 58 is formed on silicon semiconductor substrate 51 to cover gate electrode portion 55. On silicon oxide film 58, a silicon oxide film doped with boron and phosphorous, that is, a BPSG (Boro-Phospho-Silicate-Glass) film 59 is formed. A silicon oxide film 60 is formed on BPSG film 59. A plurality of second interconnection layers 62 including a polycrystalline silicon film 62a, a tungsten silicide film 62b and a silicon oxide film 62c are formed on silicon oxide film 60. One second interconnection layer 62 is electrically connected to gate electrode portion 55 as a first interconnection layer by a polycrystalline silicon film filled in contact hole 61a that is formed in BPSG film 59 and silicon oxide films 60, 58. Another second interconnection layer 62 is electrically connected to impurity diffusion layer 56b by a polycrystalline silicon film filled in a contact hole 61b that is formed in BPSG film 59 and silicon oxide films 60, 58. A silicon oxide film 63 is formed on silicon oxide film 60 to cover second interconnection layer 62. A BPSG film 64 is also formed on silicon oxide film 63. A plurality of third interconnection layers 67 are formed on BPSG film 64.

Third interconnection layers 67 are electrically connected to gate electrode portion 55 and impurity diffusion layers 56c, 56d by plugs 66a, 66b, 66c e.g. of tungsten filled in contact holes 65a, 65b, 65c that are formed in BPSG films 59, 64 and silicon oxide films 63, 60, 58. Third interconnection layer 67 is also electrically connected to second interconnection layer 62 by a plug 66d filled in a contact hole 65d that is formed in BPSG film 64 and silicon oxide film 63. The conventional semiconductor device has such a configuration.

One example of the method of manufacturing the above described semiconductor device will be described in the following with reference to the drawings. Referring to FIG. 48, element separating trench 52 is formed at the surface of silicon semiconductor substrate 51 by prescribed photolithography and RIE (Reactive Ion Etching) methods. To fill element separating trench 52, a silicon oxide film (not shown) having a film thickness of approximately 300 to 800 nm is then formed on silicon semiconductor substrate 51 by the CVD method. The silicon oxide film is polished by the CMP (Chemical Mechanical Polishing) method to form separating oxide film 53 in element separating trench 52. Gate oxide film 54 having a film thickness of 5 to 15 nm is then formed on the surface of silicon semiconductor substrate 51 by the thermal oxidation method. On gate oxide film 54, a polycrystalline silicon film containing phosphorous or arsenic, a tungsten silicide film and a silicon oxide film (they are not shown) are formed. A plurality of gate electrode portions 55 as the first interconnection layers including polycrystalline silicon film 55a, tungsten silicide film 55b and silicon oxide film 55c are formed by the prescribed photolithography and RIE methods. By implanting an impurity of a prescribed conductive type into silicon semiconductor substrate 51 using gate electrode portion 55 as a mask, a region (not shown) of a comparatively low impurity concentration is formed.

To cover gate electrode portion 55, a silicon oxide film (not shown) having a film thickness of approximately 10 to 50 nm is then formed on silicon semiconductor substrate 51 by the CVD method. The silicon oxide film is etched by the RIE method to form sidewall insulating film 57 on the both side surfaces of gate electrode portion 55. By implanting an impurity of a prescribed conductive type into silicon semiconductor substrate 51 using sidewall insulating film 57 and gate electrode portion 55 as a mask, a region (not shown) of a comparatively high impurity concentration is formed. Thus, a pair of impurity diffusion layers 56a, 56b and a pair of impurity diffusion layers 56c, 56d are respectively formed at the surface of silicon semiconductor substrate 51 with gate electrode potions 55 sandwiched therebetween. Thereafter, comparatively thin silicon oxide film 58 is formed on silicon semiconductor substrate 51 by the CVD method to cover gate electrode portion 55. BPSG film 59 is formed on silicon oxide film 58 by the CVD method.

Referring to FIG. 49, BPSG film 59 is heated at a temperature of approximately 850° C. to locally planarize the surface of BPSG film 59. In other words, BPSG film 59 is reflowed. Locally planarizeed BPSG film 59 is etched by the RIE method or a hydrofluoric acid solution to make BPSG film 59 thinner.

Referring to FIG. 50, comparatively thin silicon oxide film 60 is formed on BPSG film 59 by the CVD method. Then, contact hole 61a exposing the surface of tungsten silicide film 55b of gate electrode portion 55 and contact hole 61b exposing the surface of impurity diffusion layer 56b are formed in BPSG film 59 and silicon oxide films 60, 58 by the prescribed photolithography and RIE methods. A polycrystalline silicon film, a tungsten silicide film and a silicon oxide film (they are not shown) are then formed on silicon oxide film 60 by the CVD method. Second interconnection layer 62 including polycrystalline silicon film 62a, tungsten silicide film 62b and silicon oxide film 62c is then formed by the prescribed photolithography and RIE methods.

Referring to FIG. 51, comparatively thin silicon oxide film 63 is formed on silicon oxide film 60 by the CVD method to cover second interconnection layer 62. BPSG film 64 is then formed on silicon oxide film 63 by the CVD method.

Referring to FIG. 52, BPSG film 64 is heated at a temperature of approximately 800° C. to locally planarize the surface of BPSG film 64. Thereafter, BPSG film 64 is etched by the RIE method or a hydrofluoric acid solution, if necessary, to further planarize the surface of BPSG film 64.

Referring to FIG. 53, contact hole 65a exposing the surface of tungsten silicide film 55b of gate electrode portion 55, contact holes 65b, 65c exposing the surfaces of impurity diffusion layers 56c, 56d, and contact hole 65d exposing the surface of tungsten silicide film 62b of second interconnection layer 62 are formed in BPSG film 64 by the prescribed photolithography and RIE methods. Thereafter, an impurity of a prescribed conductive type is implanted in contact holes 65a, 65b, 65c, 65d. The impurity is activated by heating at a temperature of 750° C. lower than the heating temperature for locally planaiizing BPSG film 64.

Then, a tungsten thin film (not shown) is formed on BPSG film 64 by the CVD method using $WF_6$, for example, as a material. The tungsten thin film is etched by the RIE method to form tungsten plugs (not shown) in contact holes 65a, 65b, 65c, 65d. An aluminum copper alloy film (not shown) is formed on BPSG film 64 by the sputtering method. Then, the third interconnection layers electrically connected to gate electrode portion 55, impurity diffusion layers 56c, 56d and the like are formed by the prescribed photolithography and RIE methods to complete the semiconductor device shown in FIG. 47. The conventional semiconductor device is manufactured as described above.

As LSIs miniaturize in recent, years, processing of contact holes 61a, 61b, 65a to 65d, second interconnection layer 62 and third interconnection layer 67 with high dimensional precision is becoming difficult. Especially, in order to ensure prescribed dimensional precision in a lateral direction, the NA value (Numerical Aperture) of a lens used for an exposing device is set at a higher value to improve resolution in photolithography. When the planarity of a film surface to be applied with a resist is poor, however, halation makes it difficult to form a pattern that is highly dimensionally precise. Since the NA value of a lens is set at a higher value, it is difficult to ensure the depth of focus. In filling polycrystalline silicon, tungsten or the like in contact holes 61a, 61b, 65a to 65d that are formed in BPSG films 59, 64 and the like, the polycrystalline silicon or tungsten may be left without being etched at the step portions of BPSG films 59, 64. Therefore, more planarized surface shapes are required for BPSG film 59 serving as the base of second interconnection layer 62 and BPSG film 64 serving as the base of third interconnection layer 67.

Here, the step portions of the BPSG films are locally planarized by heating. The degree of planarization depends on the concentration of boron and phosphorous contained in the BPSG films, the heating temperature and the like, and the BPSG films are locally planarized to a greater extent as the concentration of boron and phosphorous is higher or as the temperature is higher.

When the concentration of boron and phosphorous in lower layer BPSG film 59 is made almost the same as the concentration of boron and phosphorous in upper layer BPSG film 64 so as to ensure the planarity of the base of second interconnection layer 62, lower layer BPSG film 59 is also reflowed and transformed in heating upper layer BPSG film 64. Therefore, second interconnection layer 62 formed on BPSG film 59 might be displaced as BPSG film 59 is transformed. Thus, second interconnection layer 62, for example, might come into contact with tungsten plug 66b, causing an electrical short.

In order to suppress such displacement of second interconnection layer 62, the displacement can be suppressed to approximately 1 μm by setting lower the heating temperature for upper layer BPSG film 64. In order to cope with the requirement for the heating at a lower temperature as LSIs are miniaturized, however, the lower temperature of the heating for the upper layer BPSG film is approaching a limit. As the LSIs are further miniaturized, suppressing displacement of second interconnection layer 62 to approximately 0.1 μm is required. Therefore, simultaneously ensuring the planarity of the base of the second interconnection layer and the like and preventing displacement of the second interconnection layer are expected to be extremely difficult in the conventional semiconductor device. As a result, easy miniaturization of LSIs is expected to be difficult.

SUMMARY OF THE INVENTION

The present invention aims at solving the expected problems above and its object is to provide a semiconductor device ensuring the planarity of the base of each interconnection layer and suppressing displacement of the interconnection layer in the process of manufacturing the semiconductor device thereby achieving a high degree of integration.

A semiconductor device in one aspect of the present invention includes a semiconductor substrate, a first interconnection layer, a first interlayer insulating film, a second interconnection layer, and a second interlayer insulating film. The semiconductor substrate has a main surface. The first interconnection layer is formed on the semiconductor substrate. The first interlayer insulating film is formed on the semiconductor substrate to cover the first interconnection layer. The second interconnection layer is formed on the first interlayer insulating film. The second interlayer insulating film is formed on the first interlayer insulating film to cover the second interconnection layer. The first interlayer insulating film has a polished top surface, or a film having a polished top surface is laminated on the first interlayer insulating film.

Since the first interlayer insulating film is polished according to the configuration, the surface of the first interlayer insulating film is planarized over the entire wafer surface in the manufacturing process. Thus, the second interconnection layer that is highly dimensionally precise can easily be formed on the first interlayer insulating film. When the second interlayer insulating film is formed on the first interlayer insulating film to cover the second interconnection layer, heat from the process is applied to the first interlayer insulating film. Since the surface of the first interlayer insulating film is planarized over the entire wafer surface at this time, transformation of the first interlayer insulating film is suppressed compared with the case in which the surface is rough. Thus, displacement of the second interconnection layer causing the second interconnection layer to be moved due to the transformation of the first interlayer insulating film as its base can be suppressed. As a result, a semiconductor device having a higher degree of integration can be obtained.

Preferably, the first interlayer insulating film includes an impurity-doped insulating film that contains prescribed impurities and is reflowed, and the reflowed impurity-doped insulating film has the polished top surface.

In this case, polishing is provided for the impurity-doped insulating film of which roughness of the surface is locally eased by reflow. Therefore, compared with a film of which roughness of the surface is not eased, variation in the degree of polishing in a wafer surface, and variation in the film thickness of the impurity-doped insulating film in the wafer surface can be reduced in polishing the impurity-doped insulating film.

Preferably, the first interlayer insulating film includes an impurity-doped insulating film that contains prescribed impurities and is reflowed and an impurity-non-doped insulating film that is formed on the reflowed impurity-doped insulating film and does not contain prescribed impurities, and the impurity-non-doped insulating film has the polished top surface.

In this case, the impurity-doped insulating film is covered by the impurity-non-doped insulating film. Even if the impurity-doped insulating film is reflowed and transformed by heat in forming the second interlayer insulating film, therefore, the transformation is suppressed. As a result, displacement of the second interconnection layer can be further suppressed.

Preferably, the first interlayer insulating film includes an impurity-non-doped insulating film that does not contain prescribed impurities, and the impurity-non-doped insulating film has the polished top surface.

In this case, the impurity-non-doped insulating film does not contain the prescribed impurities. Therefore, the impurity-non-doped insulating film is not reflowed and transformed by heat in forming the second interlayer insulating film. Thus, the second interconnection layer is not displaced.

More preferably, the first interlayer insulating film includes a first dipped insulating film formed on the semiconductor substrate by the Spin-On-Glass method to fill a space between the first interconnection layers, and the impurity-non-doped insulating film is formed on the first dipped insulating films.

In this case, the first dipped insulating film eases the roughness of the surface of the impurity-non-doped insulating film before it is polished. Thus, variation in the degree of polishing in the wafer surface can be reduced in polishing the impurity-non-doped insulating film.

Preferably, the second interlayer insulating film includes an interconnection coating insulating film that has a thickness allowing fixing and holding of the second interconnection layer and covers the second interconnection layer.

In this case, the second interconnection layer is fixed more strongly on the first interlayer insulating film by the interconnection coating insulating film. Thus, even if the first interlayer insulating film is transformed by heat in a subsequent manufacturing process, displacement of the second interconnection layer can further be suppressed.

Preferably, the second interlayer insulating film includes a second dipped insulating film formed on the first interlayer insulating film by the Spin-On-Glass method to fill a space between the second interconnection layers or to cover the second interconnection layers.

In this case, the second interconnection layer is fixed more strongly on the first interlayer insulating film by the second dipped insulating film. Thus, even if the first interlayer insulating film is transformed by heat in a subsequent manufacturing process, displacement of the second interconnection layer can be suppressed effectively. The roughness of the wafer surface can also be eased by the second dipped insulating film. Thus, the planarity of a film formed on the second dipped insulating film can be ensured easily.

More preferably, the second interlayer insulating film includes an interconnection protecting film formed between the second interconnection layer and the second dipped insulating film.

In this case, diffusion of an impurity such as hydrogen contained in the second dipped insulating film to the second interconnection layer can be prevented.

A semiconductor device in another aspect of the present invention includes a semiconductor substrate, a first interconnection layer, a first interlayer insulating film, a second interconnection layer, and second interlayer insulating film. The semiconductor substrate has a main surface. The first interconnection layer is formed on the semiconductor substrate. The first interlayer insulating film is formed on the semiconductor substrate to cover the first interconnection layer. The second interconnection layer is formed on the first interlayer insulating film. The second interlayer insulating film is formed on the first interlayer insulating film to cover the second interconnection layer. The first interlayer insulating film includes an impurity-doped insulating film that contains prescribed impurities and is reflowed. The second interlayer insulating film has an interconnection coating insulating film that has a thickness allowing fixing and holding of the second interconnection layer and covers the second interconnection layer.

According to the configuration, the surface of the first interlayer insulating film is locally planarized by the impurity-doped insulating film in the manufacturing process. Thus, the second interconnection layer that is highly dimensionally precise can easily be formed on the first interlayer insulating film. The second interconnection layer is fixed more strongly on the first interlayer insulating film by the interconnection coating insulating film. Thus, even if the impurity-doped insulating film is reflowed and transformed by heat in a sequent manufacturing process, displacement of the second interconnection layer causing the second interconnection layer to be moved due to the transformation of the impurity-doped insulating film can be suppressed. As a result, a semiconductor device having a higher degree of integration can be obtained.

Preferably, the interconnection coating insulating film has a thickness of at least the thickness of the second interconnection layer.

In this case, the second interconnection layer is fixed more reliably on the first interlayer insulating film by the interconnection coating insulating film. Thus, displacement of the second interconnection layer can be suppressed more reliably.

Preferably, the second interlayer insulating film is polished or reflowed.

In this case, a pattern that is highly dimensionally precise can easily be formed on the second interlayer insulating film.

Preferably, the interconnection coating insulating film includes a third dipped insulating film formed by the Spin-On-Glass method to fill a space between the second interconnection layers or to cover the second interconnection layers.

In this case, the roughness of the wafer surface is eased by the third dipped insulating film, and thereafter the planarity of a film formed on the third dipped insulating film can easily be ensured.

More preferably, the second interlayer insulating film includes an interconnection protecting film formed between the second interconnection layer and the third dipped insulating film.

In this case, diffusion of an impurity such as hydrogen contained in the third dipped insulating film to the second interconnection layer can be prevented.

More preferably, an insulating film that does not contain prescribed impurities is formed on the top surface or the bottom surface of the impurity-doped insulating film.

In this case, diffusion of the prescribed impurities contained in the impurity-doped insulating film upward or downward of the impurity-doped insulating film can be prevented by the insulating film.

More preferably, the first interlayer insulating film includes a substrate coating insulating film covering the semiconductor substrate.

In this case, diffusion of prescribed impurities contained in the impurity-doped insulating film to the semiconductor substrate can be prevented by the substrate coating insulating film.

At least one species of impurities selected from the group of boron, phosphorous and arsenic can be applied as the prescribed impurities.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
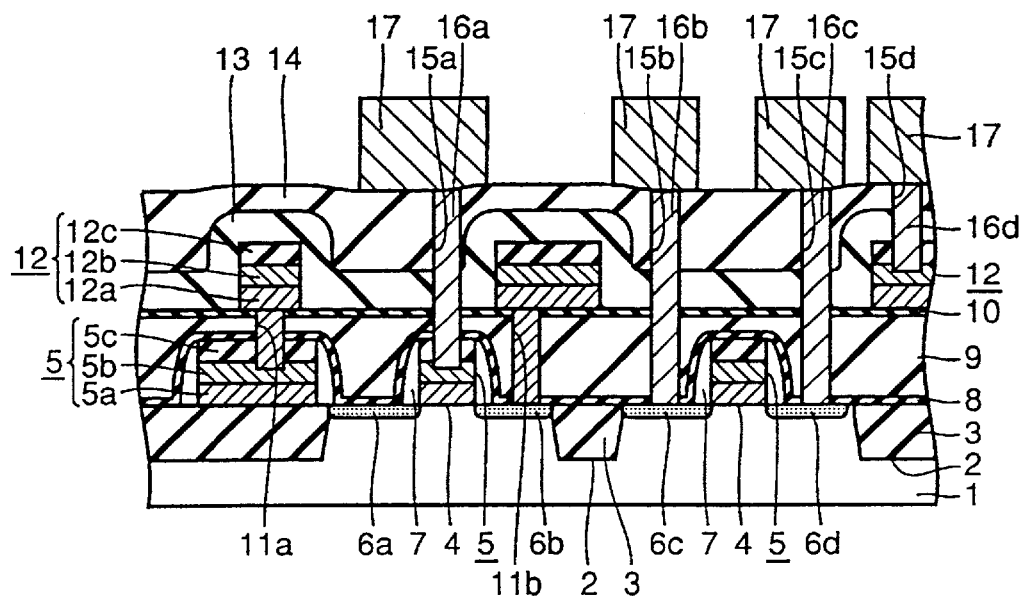
FIG. 1 is a cross sectional view showing a semiconductor device according to a first embodiment of the present invention.

A semiconductor device according to a first embodiment will be described with reference to the drawings. Referring to FIG. 1, a plurality of gate electrode portions 5 including a polycrystalline silicon film 5a, a tungsten silicide film 5b and a silicon oxide film 5c are formed on the surface of a silicon semiconductor substrate 1 with a gate insulating film 4 interposed therebetween. A pair of impurity diffusion layers 6a, 6b are formed at the surface of silicon semiconductor substrate 1 with one gate electrode portion 5 sandwiched therebetween. A pair of impurity diffusion layers 6c, 6d are formed at the surface of silicon semiconductor substrate 1 with another gate electrode portion 5 sandwiched therebetween. A sidewall insulating film 7 is formed on the both side surfaces of gate electrode portion 5. Gate electrode portion 5 and a pair of impurity diffusion layers 6a, 6b constitute one MOS transistor. Gate electrode portion 5 and a pair of impurity diffusion layers 6c, 6d constitute another MOS transistor. Gate electrode portion 5 of each MOS transistor serves as a first interconnection layer. MOS transistors are electrically insulated from one another by a separating oxide film 3 that is formed in an element separating trench 2 at the surface of silicon semiconductor substrate 1.

A silicon oxide film 8 is formed on silicon semiconductor substrate 1 to cover gate electrode portion 5. A BPSG film 9 is formed on silicon oxide film 8. After BPSG film 9 is reflowed by heating, its surface is polished. A silicon oxide film 10 is formed on polished BPSG film 9. On silicon oxide film 10, a plurality of second interconnection layers 12 including a polycrystalline silicon film 12a, a tungsten silicide film 12b and a silicon oxide film 12c are formed. One second interconnection layer 12 is electrically connected to gate electrode portion 5 as the first interconnection layer by a polycrystalline silicon film filled in a contact hole 11a that is formed in BPSG film 9 and silicon oxide films 10, 8. Another second interconnection layer 12 is electrically connected to impurity diffusion layer 6b by a polycrystalline silicon film filled in a contact hole 11b that is formed in BPSG film 9 and silicon oxide films 10, 8.

A silicon oxide film 13 is formed on silicon oxide film 10 to cover second interconnection layer 12. Silicon oxide film 13 has a thickness of at least the substantial thickness of second interconnection layer 12 (thickness of polycrystalline silicon film 12a+ thickness of tungsten silicide film 12b) as the thickness allowing fixing and holding of second interconnection layer 12 on silicon oxide film 10. A BPSG film 14 is also formed on the silicon oxide film 13. BPSG film 14 is reflowd by heating and its surface is planarized. A plurality of third interconnection layers 17 including an aluminum copper alloy film are formed on BPSG film 14. Third interconnection layers 17 are electrically connected to gate electrode portion 5 and impurity diffusion layers 6c, 6d by plugs 16a, 16b, 16c filled in contact holes 15a, 15b, 15c that are formed in BPSG films 14, 9 and silicon oxide films 13, 10, 8. Third interconnection layer 17 is electrically connected to second interconnection layer 12 by a plug 16d filled in a contact hole 15d that is formed in BPSG film 14 and silicon oxide film 13. The semiconductor device according to the embodiment has such a configuration.

Figure 2:
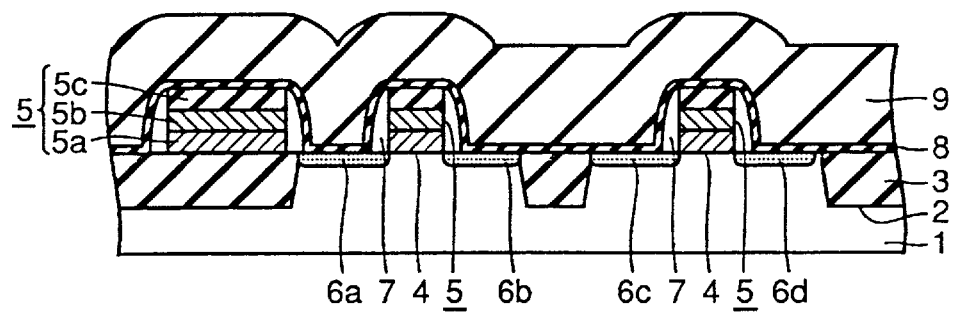
FIG. 2 is a cross sectional view showing one step of the method of manufacturing the semiconductor device shown in FIG. 1 in the first embodiment.

One example of the method of manufacturing the above described semiconductor device will be described in the following with reference to the drawings. Referring first to FIG. 2, an element separating trench 2 is formed at the surface of silicon semiconductor substrate 1 by prescribed photolithography and RIE methods. To fill element separating trench 2, a silicon oxide film (not shown) having a film thickness of approximately 300 to 800 nm is formed on silicon semiconductor substrate 1 by the CVD method. The silicon film is polished by the CMP method to form a separating oxide film 3 in element separating trench 2. Then, gate oxide film 4 having a film thickness of 5 to 15 nm is formed on the surface of silicon semiconductor substrate 1 by the thermal oxidation method. On gate oxide film 4, a polycrystalline silicon film containing phosphorous or arsenic, a tungsten silicide film and a silicon oxide film (they are not shown) are formed. A plurality of gate electrode portions 5 as the first interconnection layers including polycrystalline silicon film 5a, tungsten silicide film 5b and silicon oxide film 5c are formed by the prescribed photolithography and RIE methods.

By implanting an impurity of a prescribed conductive type into silicon semiconductor substrate 1 using gate electrode portion 5 as a mask, a region (not shown) of a comparatively low impurity concentration is formed. To cover gate electrode portion 5, a silicon oxide film (not shown) having a film thickness of approximately 10 to 50 nm is formed on silicon semiconductor substrate 1 by the CVD method. The silicon oxide film is etched by the RIE method to form sidewall insulating film 7 on the both side surfaces of gate electrode portion 5. By implanting an impurity of a prescribed conductive type into silicon semiconductor substrate 1 using sidewall insulating film 7 and gate electrode portion 5 as a mask, a region (not shown) of a comparatively high impurity concentration is formed. Thus, a pair of impurity diffusion layers 6a, 6b and a pair of impurity diffusion layers 6c, 6d are formed at the surface of silicon semiconductor substrate 1 with gate electrode portions 5 interposed therebetween. To cover gate electrode portion 5 and the like, silicon oxide film 8 having a film thickness of approximately 10 nm is then formed on silicon semiconductor substrate 1 by the CVD method. BPSG film 9 is formed on silicon oxide film 8 by the CVD method.

Figure 3:
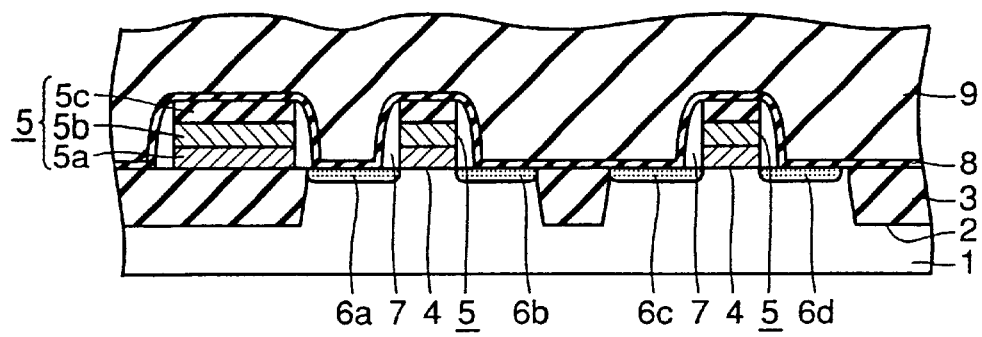
FIGS. 3 to 8 are cross sectional views respectively showing steps performed after the steps shown in FIGS. 2 to 7 in the first embodiment.
Figure 4:
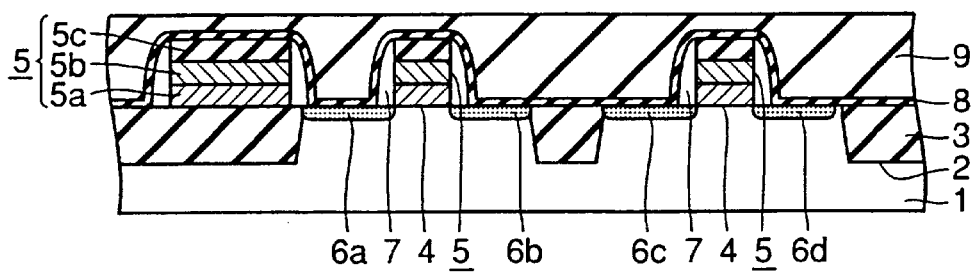

Referring to FIG. 3, BPSG film 9 is heated at a temperature of approximately 800° C. to locally planarize the surface of BPSG film 9. In other words, BPSG film 9 is reflowed. While the local roughness of the wafer surface is eased at this time, a, step cannot be eased by the BPSG film and an "absolute step" is caused at a boarder portion, for example, between a memory cell region in which MOS transistors are integrated and a region like a periphery region in which elements such as transistors are not so integrated as in the memory cell region. Referring to FIG. 4, locally planarized BPSG film 9 is polished by approximately 150 nm by the CMP method. This polishing removes the absolute step in BPSG film 9, and the surface of BPSG film 9 is planarized over the entire wafer surface.

Figure 5:
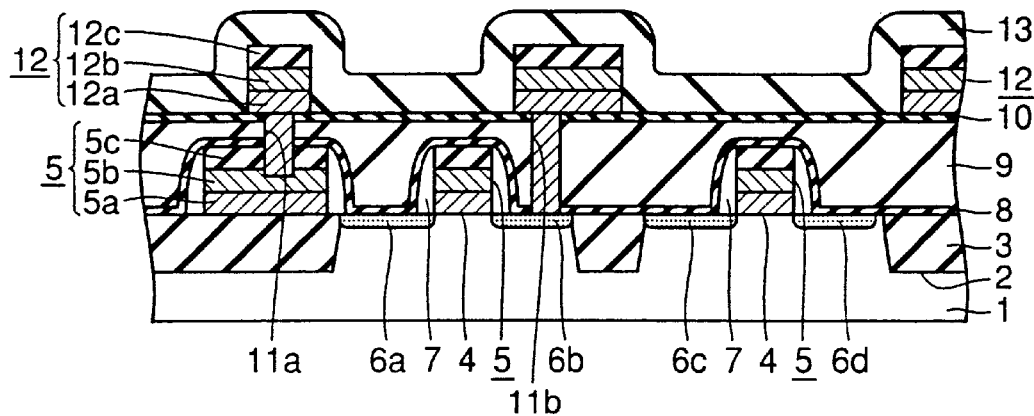

Referring to FIG. 5, silicon oxide film 10 having a film thickness of approximately 100 nm is formed on polished BPSG film 9 by the CVD method. Then, contact hole 11a exposing the surface of tungsten silicide film 5b of gate electrode portion 5 and contact hole 11b exposing the surface of impurity diffusion layer 6b are formed by the prescribed photolithography and RIE methods. To fill contact holes 11a and 11b, a polycrystalline silicon film (not shown) is formed on silicon oxide film 10. Then, a tungsten silicide film and a silicon oxide film (they are not shown) are formed by the CVD method. Thereafter, a plurality of second interconnection layers 12 including polycrystalline silicon film 12a, tungsten silicide film 12b and silicon oxide film 12c are formed by the prescribed photolithography and RIE method. It is noted that a polycrystalline silicon plugs are formed in contact holes 11a and 11b at this time. To cover second interconnection layer 12, silicon oxide film 13 is then formed on silicon oxide film 10 by the CVD method. silicon oxide film 13 has a thickness of at least the substantial thickness of the second interconnection layer (thickness of polycrystalline silicon film 12a+ thickness of tungsten silicide film 12b) as the thickness allowing fixing and holding of second interconnection layer 12 on silicon oxide film 10.

Figure 6:
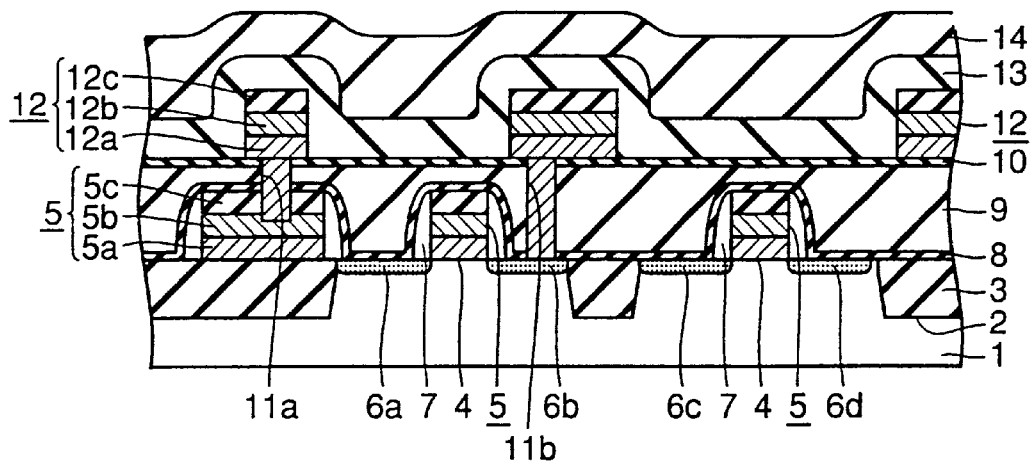
Figure 7:
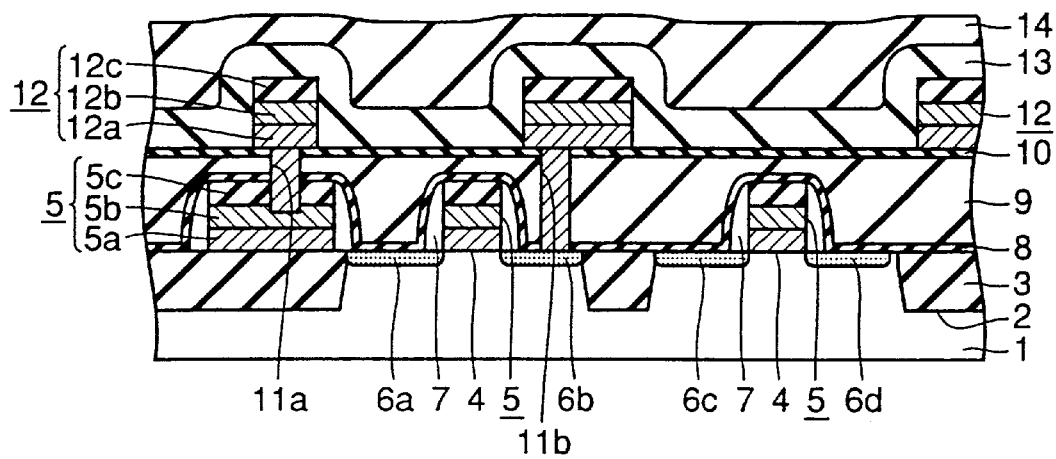

Referring to FIG. 6, BPSG film 14 is formed on silicon oxide film 13 by the CVD method. BPSG film 14 is heated at a temperature of approximately 800° C. to reflow and locally planarize the surface. As shown in FIG. 7, the reflowed surface of BPSG film 14 may be etched and made thinner by the RIE method or a hydrofluoric acid solution, if necessary, so as to make a smoother surface. The reflowed surface of BPSG film 14 may also be polished by the CMP method.

Figure 8:
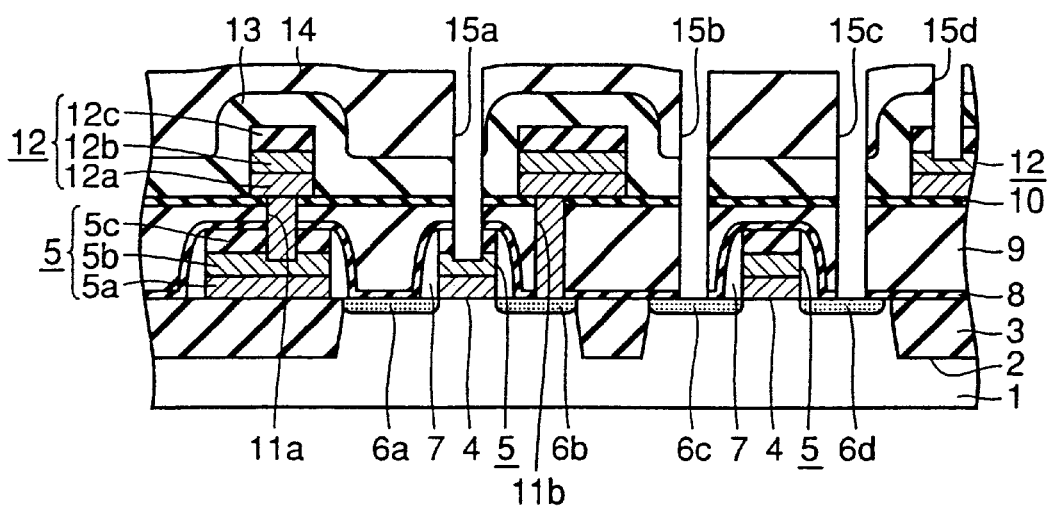

Referring to FIG. 8, contact hole 15a exposing the surface of tungsten silicide film 5b of gate electrode portion 5, contact hole 15b exposing the surface of impurity diffusion layer 6c, contact hole 15c exposing the surface of impurity diffusion layer 6d, and contact hold 15d exposing the surface of tungsten silicide film 12b of second interconnection layer 12 are formed by the prescribed photolithography and RIE methods. Then, an impurity of a prescribed conductive type is implanted into contact holes 15a, 15b, 15c, 15d, and prescribed heating is performed to activate the impurity. Desirably, the heating temperature at this time is lower than the heating temperature for reflowing BPSG film 14. Then, tungsten plugs are formed in contact holes 15a, 15b, 15c, 15d by the CVD method using $WF_6$ or the like as a material. An aluminum copper alloy film is formed on BPSG film 14 by the sputtering method. Thereafter, the third interconnection layer is formed by the prescribed photolithography and RIE methods. The semiconductor device shown in FIG. 1 is completed in this matter.

According to the above described semiconductor device, BPSG film 9 is polished in the step shown in FIG. 4. Thus, the BPSG film is planarized over the entire wafer surface. Since BPSG film 9 is planarized, halation or the like is suppressed in patterning second interconnection layer 12 in the step shown in FIG. 5, and second interconnection layer 12 with high dimensional precision is formed.

In the step shown in FIG. 6, BPSG film 14 is heated and reflowed. At this time, BPSG film 9 is also about to reflow due to the heating. Since BPSG film 9 is planarized over the entire wafer surface, however, transformation due to reflowing of BPSG film 9 is suppressed compared with the case where the surface of the BPSG film is rough and stepped. Thus, displacement of second interconnection layer 12 causing second interconnection layer 12 to be moved due to deformation of BPSG film 9 can be suppressed.

Moreover, silicon oxide film 13 formed to cover second interconnection layer 12 has a thickness of at least the substantial thickness of second interconnection layer 12 (thickness of polycrystalline silicon film 12a+ thickness of tungsten silicide film 12b). Thus, second interconnection layer 12 is fixed more strongly on silicon oxide film 10 by silicon oxide film 13, and displacement of second interconnection layer 12 can be further suppressed. As a result, a semiconductor device having a high degree of integration can be obtained.

In addition to this effect, the following effects can be attained in the above described semiconductor device. Since displacement of second interconnection layer 12 is suppressed, an electrical short caused when second interconnection layer 12 electrically comes into contact with plug 10a is suppressed, for example. Further, since the BPSG film is planarized over the entire wafer surface, occurrence of a residue of a polycrystalline silicon film due to etching can be prevented in filling a polycrystalline silicon film in contact holes 11a, 11b that are formed in BPSG film 9, silicon oxide film 10 and the like.

Further, diffusion of boron or phosphorous in BPSG film 9 to gate electrode portion 5 as the first interconnection layer or the second interconnection layer 12 and the like can be prevented by silicon oxide films 8, 10. Especially, silicon oxide film 10 formed on the surface of BPSG film 9 can also prevent formation of particles on the surface when BPSG film 9 absorbs moisture. Second interconnection layer 12 can be patterned advantageously. Silicon oxide film 10 has the effect of improving adhesion of a resist in patterning second interconnection layer 12. Silicon oxide film 13 can prevent diffusion of boron or phosphorous in BPSG film 14 to second interconnection layer 12.

In the step shown in FIG. 6, silicon oxide film 13 can prevent oxidation of second interconnection layer 12 when BPSG film 14 is heated in the atmosphere of water vapor.

Figure 9:
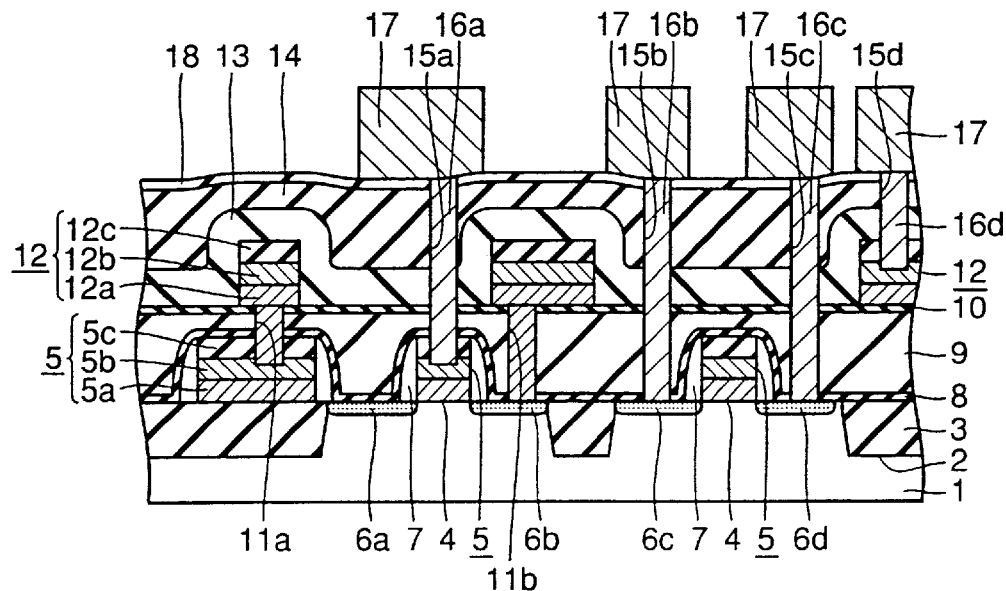
FIGS. 9 and 10 are cross sectional views showing first and second variations of the semiconductor device in the first embodiment.

A first variation of the semiconductor device shown in FIG. 1 will be described in the following with reference to the drawing. Referring to FIG. 9, a silicon oxide film 18 having a film thickness of approximately 100 nm is formed on BPSG film 14. A third interconnection layer 17 is formed on silicon oxide film 18 Since other parts are similar to the configuration of the semiconductor device shown in FIG. 1, the same elements have the same reference characters and their description will not be repeated.

According to the semiconductor device, diffusion of boron or phosphorous in BPSG film 14 to third interconnection layer 17 can be prevented by silicon oxide film 18. Silicon oxide film 18 can also prevent formation of particles on the surface of BPSG film 14 when BPSG film 14 absorbs moisture. Thus, the reliability of third interconnection layer 17 can be prevented from lowering due to the particles. Silicon oxide film 18 also has the effect of improving adhesion of a resist in patterning third interconnection layer 17. As a film formed on BPSG film 14, a laminate film of a silicon oxynitride film or a silicon nitride film and a silicon oxide film may be employed in addition to a silicon oxide film. In this case, silicon oxide film 18 can also serve as a film for preventing reflection in the lithography for forming contact holes 15a, 15b, 15c. Approximately 40 nm is preferred for a film thickness in this case.

Figure 10:
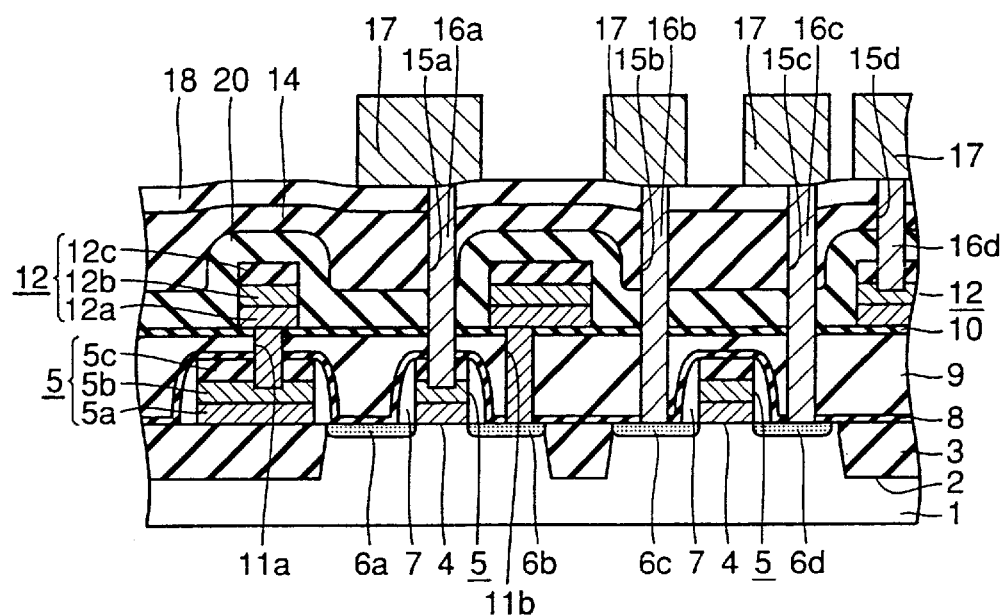

A second variation of the semiconductor device shown in FIG. 1 will be described in the following with reference to the drawing. Referring to FIG. 10, a PSG (Phospho Silicate Glass) film 20 is formed on silicon oxide film 10 to cover second interconnection layer 12. BPSG film 14 is formed on PSG film 20. Since other parts are similar to the configuration of the semiconductor device shown in FIG. 1, the same elements have the same reference characters and their description will not be repeated.

Figure 11:
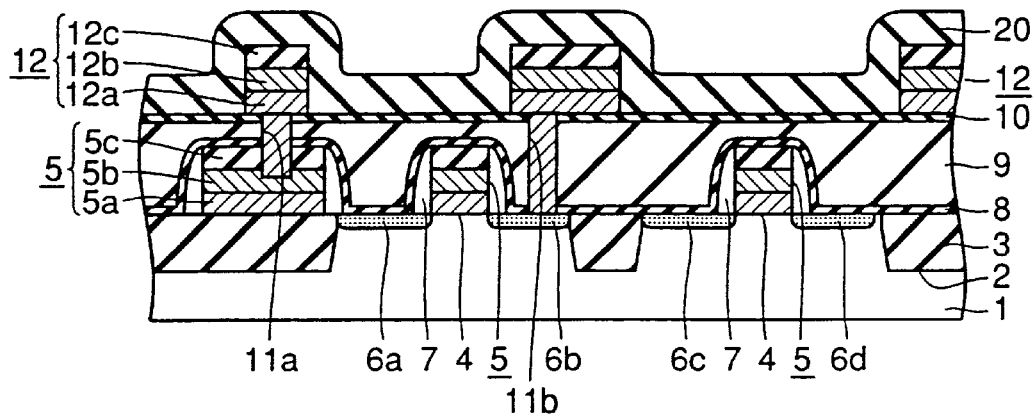
FIG. 11 is a cross sectional view showing one step of the method of manufacturing the semiconductor device shown in FIG. 10 in the first embodiment.

One example of the method of manufacturing the semiconductor device shown in FIG. 10 will be briefly described in the following. Referring to FIG. 11, steps before formation of second interconnection layer 12 on silicon oxide film 10 are similar to the steps shown in FIGS. 2 to 5. To cover second interconnection layer 12, PSG film 20 is formed on silicon oxide film 10 by the CVD method. PSG film 20 has a thickness of at least the substantial thickness of second interconnection layer 12 (thickness of polycrystalline silicon film 12a+ thickness of tungsten silicide film 12b).

Figure 12:
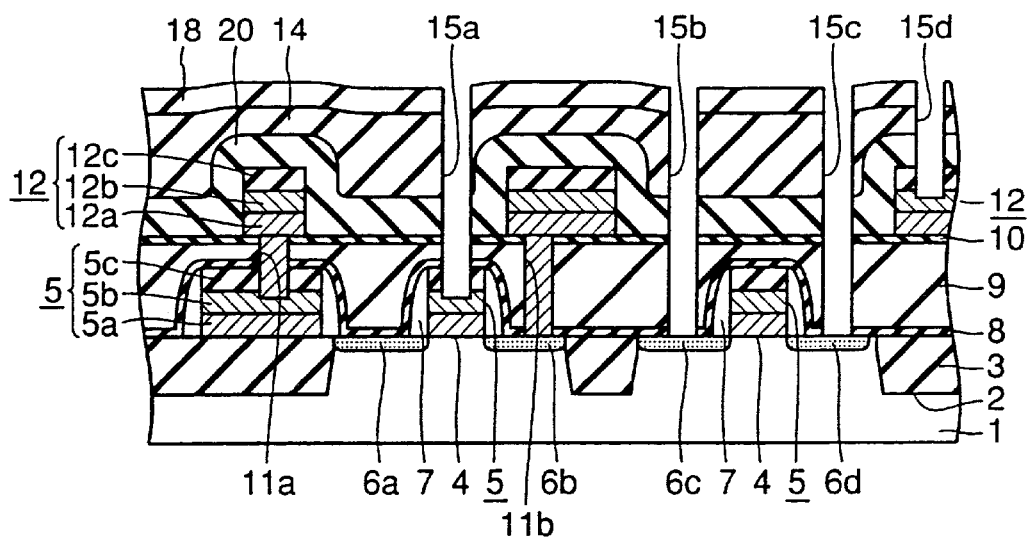
FIG. 12 is a cross sectional view showing a step performed after the step shown in FIG. 11 in the first embodiment.

Referring to FIG. 12, steps similar to the steps shown in FIGS. 6 to 8 are performed to form contact holes 15a, 15b, 15c, 15d. Then, tungsten plugs for filling contact holes 15a, 15b, 15c, 15d are formed and the third interconnection layer such as an aluminum copper alloy film is formed on silicon oxide film 18 to complete the semiconductor device shown in FIG. 10.

In the above described semiconductor device, second interconnection layer 12 is covered by PSG film 20. Since PSG film 20 is not softened by heating for reflowing BPSG film 14, second interconnection layer 12 can be fixed more strongly on silicon oxide film 10. Thus, even if PSG film 20 is applied in stead of silicon oxide film 13 shown in FIG. 1, displacement of second interconnection layer 12 can be suppressed.

Second Embodiment

Figure 13:
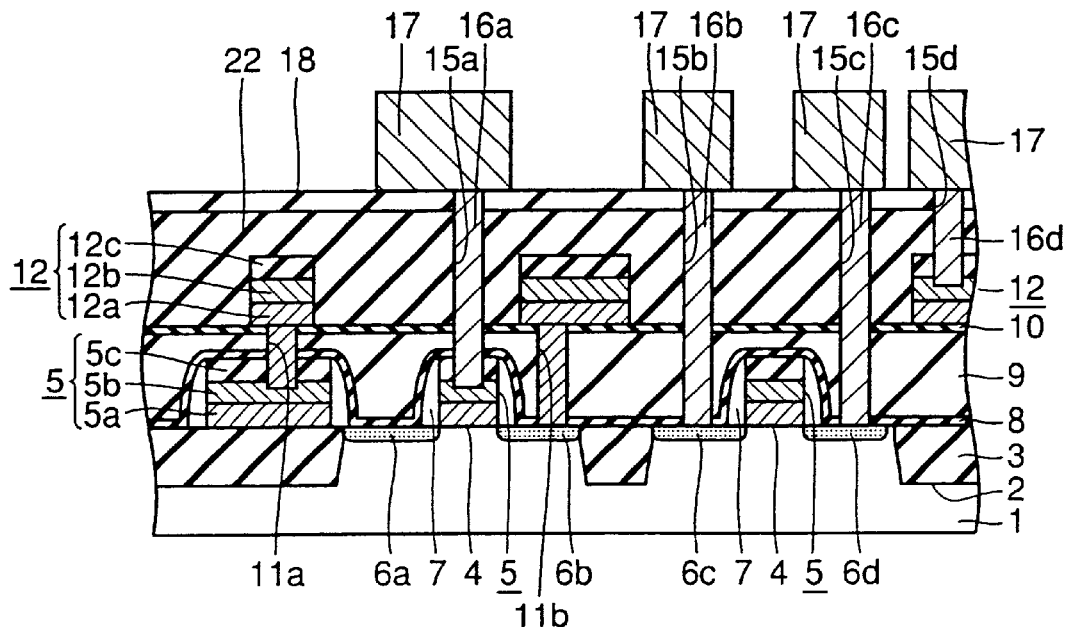
FIG. 13 is a cross sectional view showing a semiconductor device according to a second embodiment of the present invention.

A semiconductor device according to a second embodiment will be described with reference to the drawings. Referring to FIG. 13, a comparatively thick PSG film 22 is formed on silicon oxide film 10 to cover second interconnection layer 12. PSG film 22 is polished by the CMP method. Silicon oxide film 18 is formed on PSG film 22. Third interconnection layer 17 is formed on silicon oxide film 18. Since other parts are similar to the configuration of the semiconductor device shown in FIG. 1 described in the first embodiment, the same elements have the same reference characters and their description will not be repeated.

Figure 14:
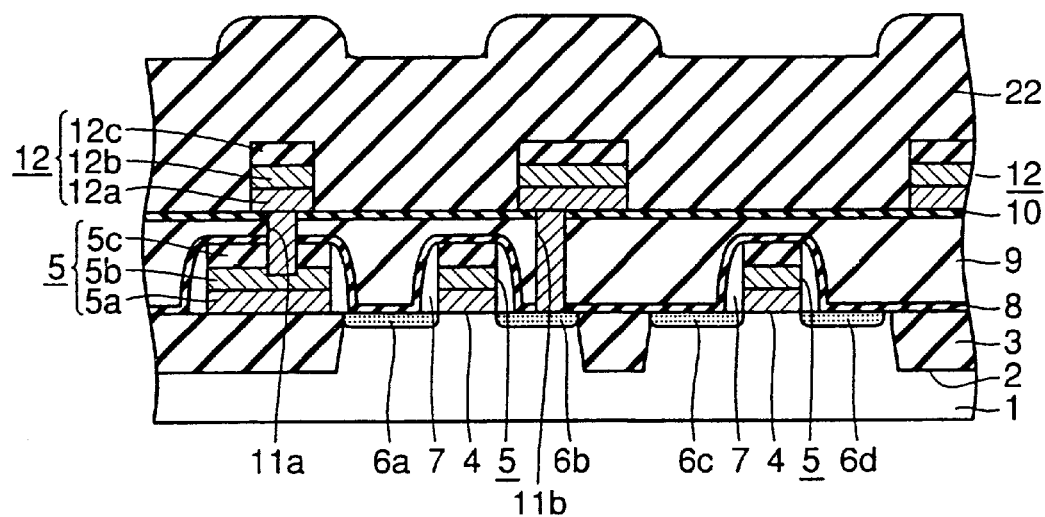
FIG. 14 is a cross sectional view showing one step of the method of manufacturing the semiconductor device shown in FIG. 13 in the second embodiment.

One example of the method of manufacturing the above described semiconductor device will be described in the following with reference to the drawings. Referring to FIG. 14, steps before formation of second interconnection layer 12 on silicon oxide film 10 are similar to the steps shown in FIGS. 2 to 5 described in the first embodiment. To cover second interconnection layer 12, comparatively thick PSG film 22 is then formed on silicon oxide film 10 by the CVD method.

Figure 15:
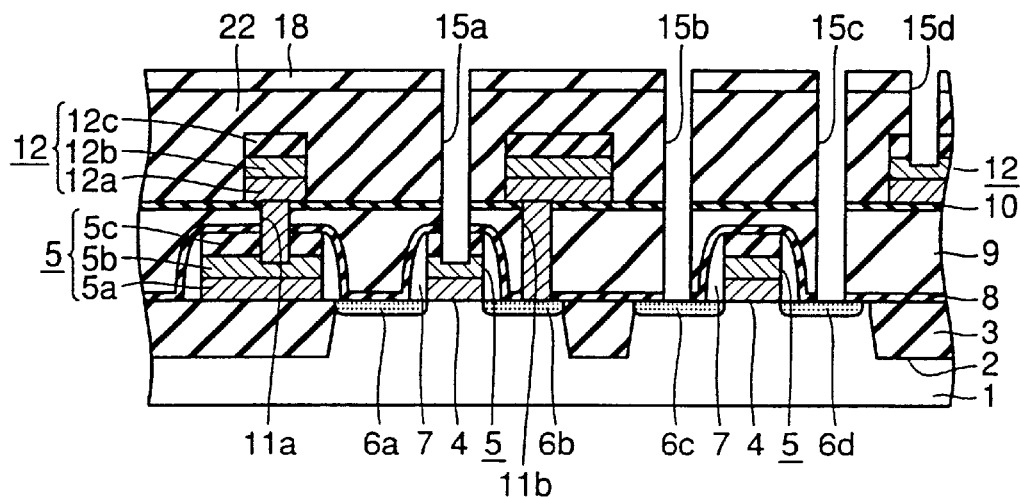
FIG. 15 is a cross sectional view showing a step performed after the step shown in FIG. 14 in the second embodiment.

Referring to FIG. 15, PSG film 22 is polished by the CMP method to planarize PSG film 22 over the entire wafer surface. Silicon oxide film 18 is formed on polished PSG film 22 by the CVD method. Then, contact holes 15a, 15b, 15c, 15d are formed by the prescribed photolithography and RIE methods. Thereafter, tungsten plugs are filled in contact holes 15a, 15b, 15c, 15d and the third interconnection layer is formed on silicon oxide film 18 to complete the semiconductor device shown in FIG. 13.

Especially, the following effects are attained in the above described semiconductor device. Since second interconnection layer 12 is covered by comparatively thick PSG film 22, second interconnection layer 12 can be fixed more strongly on silicon oxide film 10. As a result, displacement of second interconnection layer 12 can be further suppressed. Since the surface of PSG film 22 is polished by the CMP method, the surface is planarized over the entire wafer surface. Thus, third interconnection layer 17 with high dimensional precision can easily be formed. As described above, a semiconductor device having a high degree of integration can be obtained.

Third Embodiment

Figure 16:
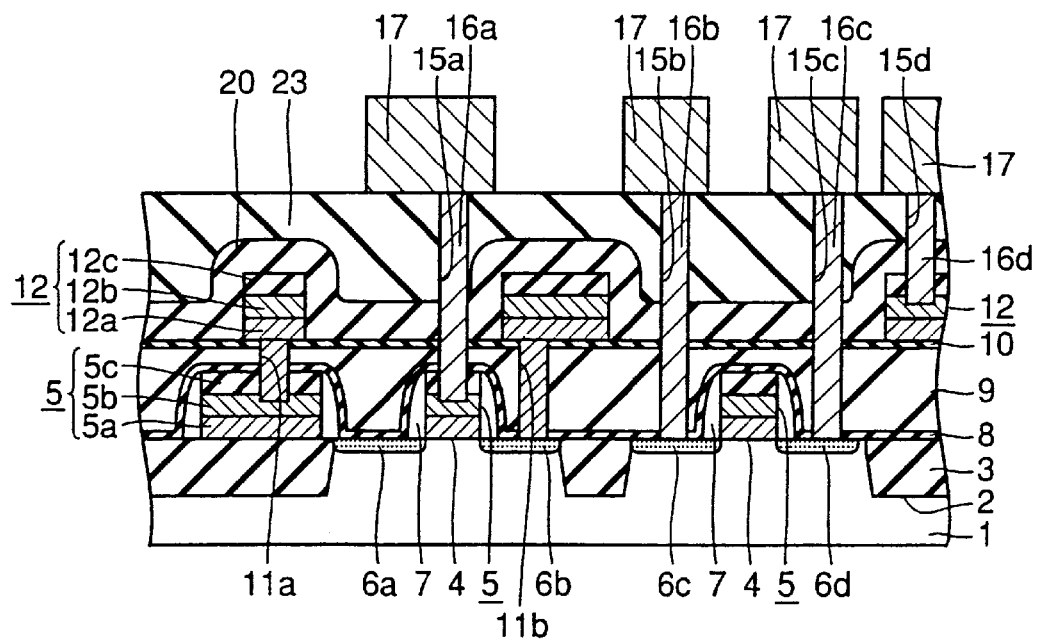
FIG. 16 is a cross sectional view showing a semiconductor device according to a third embodiment of the present invention.

A semiconductor device according to a third embodiment will be described with reference to the drawings. Referring to FIG. 16, PSG film 20 is formed on silicon oxide film 10 to cover second interconnection layer 12. PSG film 20 has a thickness of at least the substantial thickness of second interconnection layer 12. A comparatively thick silicon oxide film 23 is formed on PSG film 20. Silicon oxide film 23 is polished by the CMP method. Third interconnection layer 17 is formed on silicon oxide film 23. Since other parts are similar to the configuration of the semiconductor device shown in FIG. 1 described in the first embodiment, the same elements have the same reference characters and their description will not be repeated.

Figure 17:
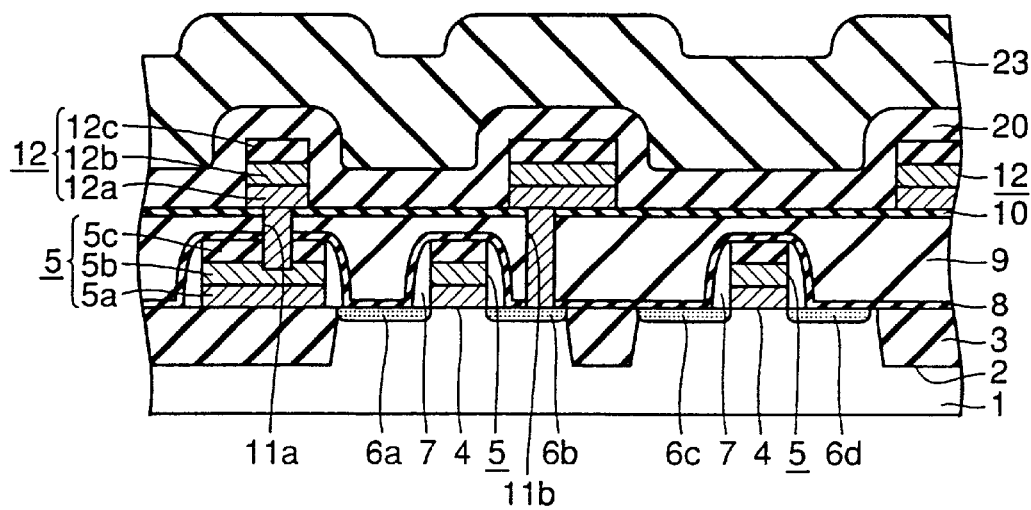
FIG. 17 is a cross sectional view showing one step of the method of manufacturing the semiconductor device shown in FIG. 16 in the third embodiment.

One example of the method of manufacturing the above described semiconductor device will be described in the following with reference to the drawings. Referring to FIG. 17, steps before formation of second interconnection layer 12 on silicon oxide film 10 are similar to the steps shown in FIGS. 2 to 5 described in the first embodiment. To cover second interconnection layer 12, PSG film 20 is then formed on silicon oxide film 10 by the CVD method. Comparatively thick silicon oxide film 23 is formed on PSG film 20 by the CVD method.

Figure 18:
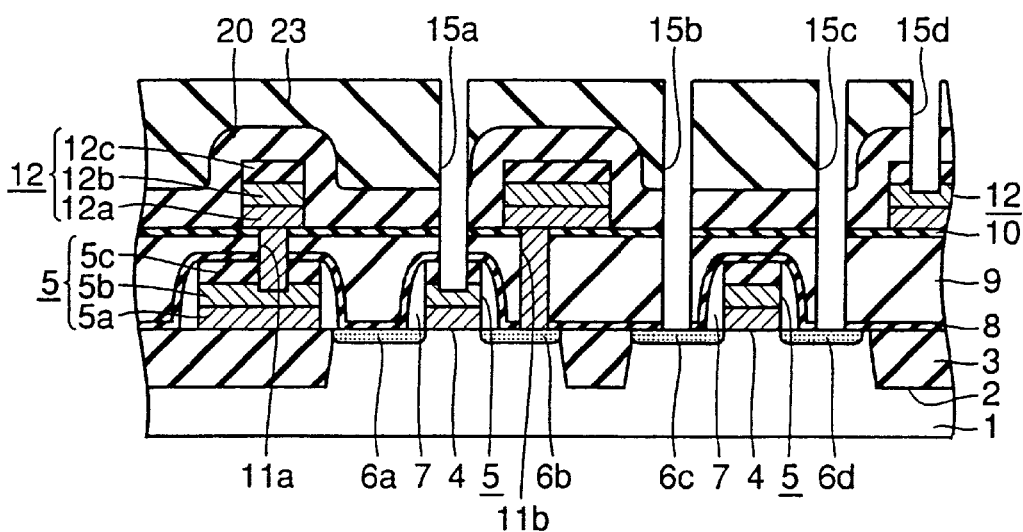
FIG. 18 is a cross sectional view showing a step performed after the step shown in FIG. 17 in the third embodiment.

Referring to FIG. 18, PSG film 23 is polished by the CMP method to planarize the surface of PSG film 23 over the entire wafer surface. Then, contact holes 15a, 15b, 15c, 15d are formed by the prescribed photolithography and RIE methods. Plugs, for example, of tungsten are formed in contact holes 15a, 15b, 15c, 15d and the third interconnection layer is formed on silicon oxide film 23 to complete the semiconductor device shown in FIG. 16.

Especially, the following effects are attained in the above described semiconductor device. Since second interconnection layer 12 is fixed more strongly on silicon oxide film 10 by PSG film 20, displacement of second interconnection layer 12 is further suppressed. Further, silicon oxide film 23 can prevent diffusion of phosphorous contained in PSG film 20 to third interconnection layer 17. Since the surface of silicon oxide film 23 is polished by the CMP method, the surface is planarized over the entire wafer surface. Thus, third interconnection layer 17 with higher dimensional precision can easily be formed.

Fourth Embodiment

Figure 19:
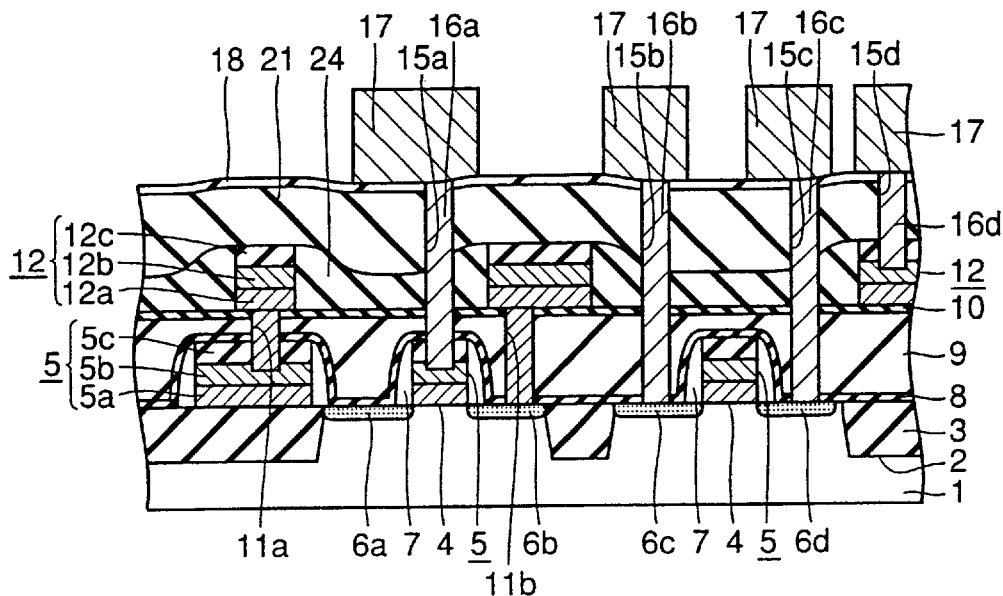
FIG. 19 is a cross sectional view showing a semiconductor device according to a fourth embodiment of the present invention.

A semiconductor device according to a fourth embodiment will be described with reference to the drawings. Referring to FIG. 19, an insulating film (hereinafter referred to as an "SOG film") 24 is formed on silicon oxide film 10 by a dipping method (Spin-On-Glass method)to fill a space between second interconnection layers 12. BPSG film 21 is formed on SOG film 24. BPSG film 21 is reflowed by heating. Silicon oxide film 18 is formed on reflowed BPSG film 21. Third interconnection layer 17 is formed on silicon oxide film 18. Since other parts are similar to the configuration of the semiconductor device shown in FIG. 1 described in the first embodiment, the same elements have the same reference characters and their description will not be repeated.

Figure 20:
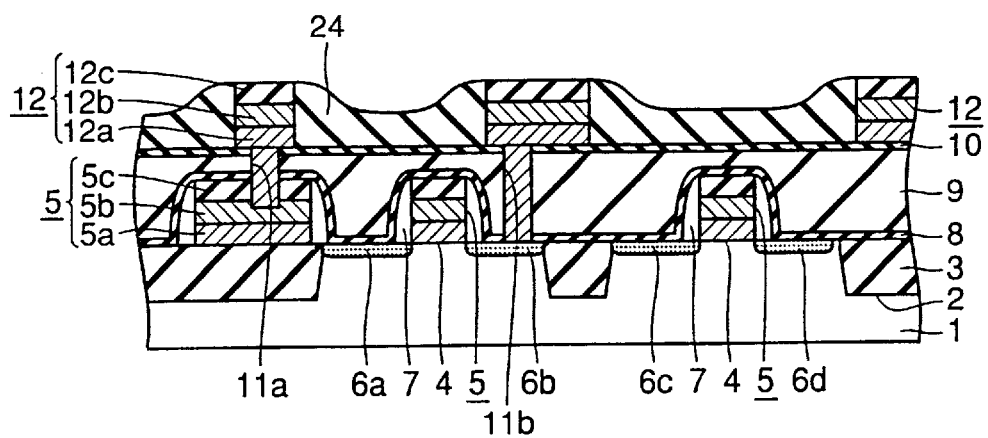
FIG. 20 is a cross sectional view showing one step of the method of manufacturing the semiconductor device shown in FIG. 19 in the fourth embodiment.

One example of the method of manufacturing the above described semiconductor device will be described in the following with reference to the drawings. Referring to FIG. 20, steps before formation of second interconnection layer 12 on silicon oxide film 10 are similar to the steps shown in FIGS. 2 to 5 described in the first embodiment 1. To fill a space between second interconnection layers 12, SOG film 24 is then formed on silicon oxide film 10 by the dipping method.

Figure 21:
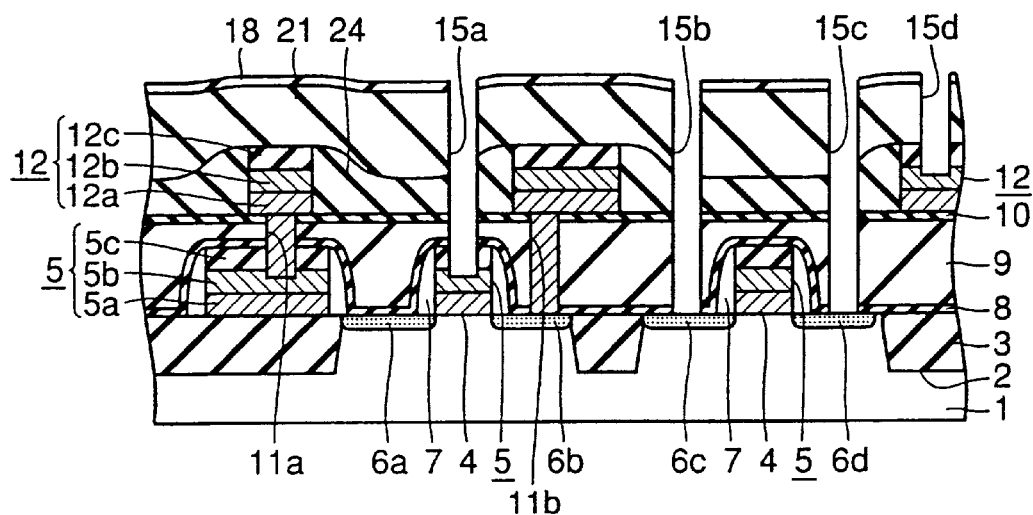
FIG. 21 is a cross sectional view showing a step performed after the step shown in FIG. 20 in the fourth embodiment.

Referring to FIG. 21, BPSG film 21 is formed on SOG film 24 by the CVD method. BPSG film 21 is heated to reflow BPSG film 21. Silicon oxide film 18 is formed on reflowed BPSG film 21. Then, contact holes 15a, 15b, 15c, 15d are formed by the prescribed lithography and RIE methods. Tungsten plugs are filled in contact holes 15a, 15b, 15c, 15d and the third interconnection layer is formed on silicon oxide film 18 to complete the semiconductor device shown in FIG. 19.

Especially, the following effects are attained in the above described semiconductor device. Second interconnection layer 12 is fixed more strongly on silicon oxide film 10 by SOG film 24. Thus, even if BPSG film 9 is transformed by the heating for reflowing BPSG film 21, displacement of second interconnection layer 12 can be suppressed effectively. Since the roughness of the wafer surface is eased by SOG film 24, the roughness of the surface of BPSG film 21 formed on SOG film 24 is eased. Accordingly, the surface of BPSG film 21 after it is reflowed is further planarized. Therefore, third interconnection layer 17 with high dimensional precision can easily be formed.

Fifth Embodiment

Figure 22:
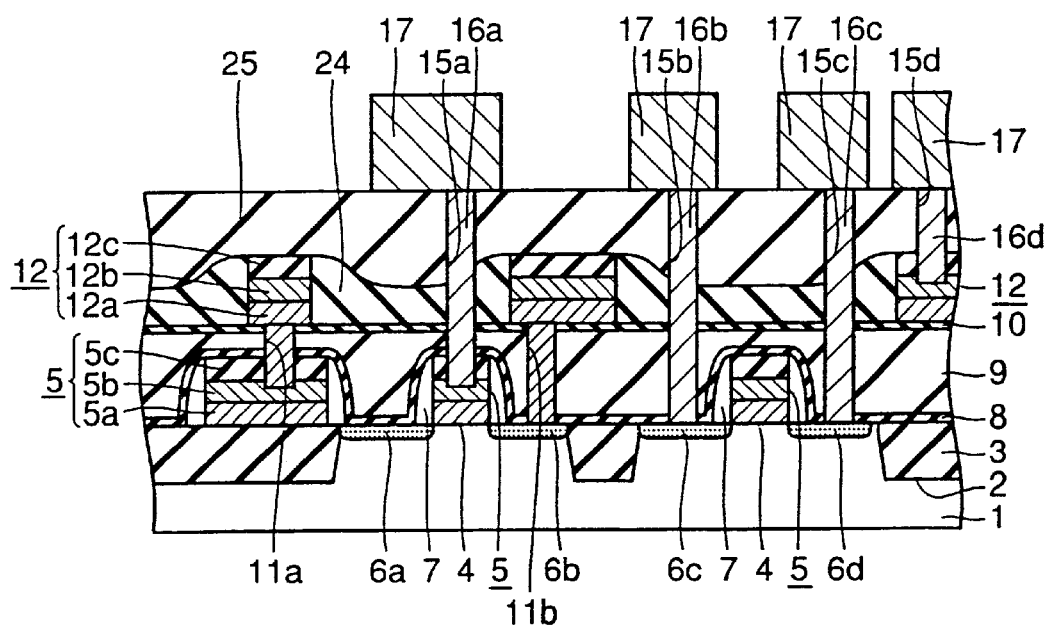
FIG. 22 is a cross sectional view showing a semiconductor device according to a fifth embodiment of the present invention.

A semiconductor device according to a fifth embodiment will be described with reference to the drawings. Referring to FIG. 22, SOG film 24 is formed on silicon oxide film 10 to fill a space between second interconnection layers 12. A silicon oxide film 25 is formed on SOG film 24. Silicon oxide film 25 is polished by the CMP method. Third interconnection layer 17 is formed on silicon oxide film 25. Since other parts are similar to the configuration of the semiconductor device shown in FIG. 1 described in the first embodiment, the same elements have the same reference characters and their description will not be repeated.

Figure 23:
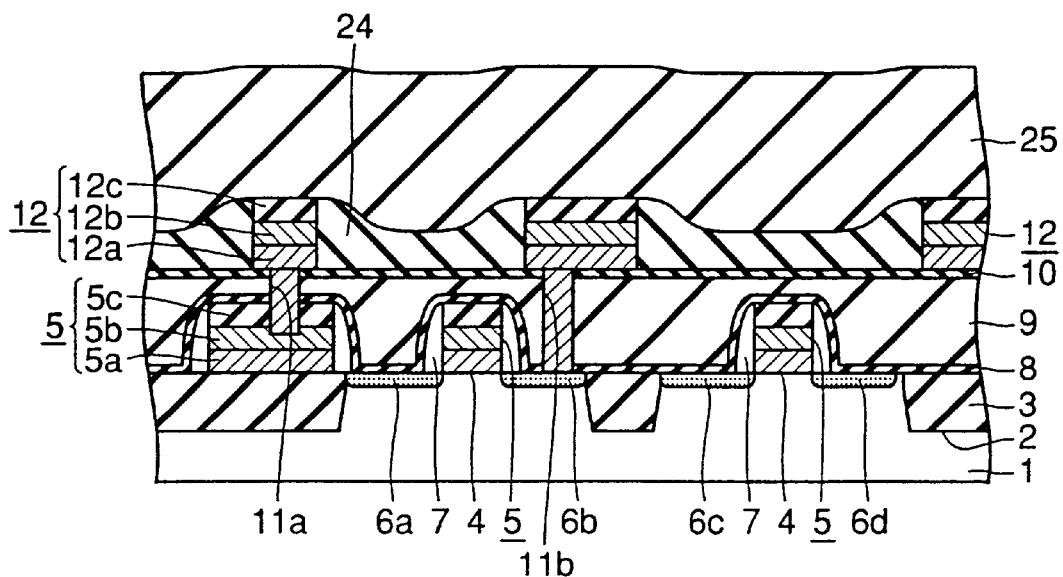
FIG. 23 is a cross sectional view showing one step of the method of manufacturing the semiconductor device shown in FIG. 22 in the fifth embodiment.

One example of the method of manufacturing the above described semiconductor device will be described in the following with reference to the drawings. Referring to FIG. 23, comparatively thick silicon oxide film 25 is formed on SOG film 24 by the CVD method after the step shown in FIG. 20 described in the fourth embodiment.

Figure 24:
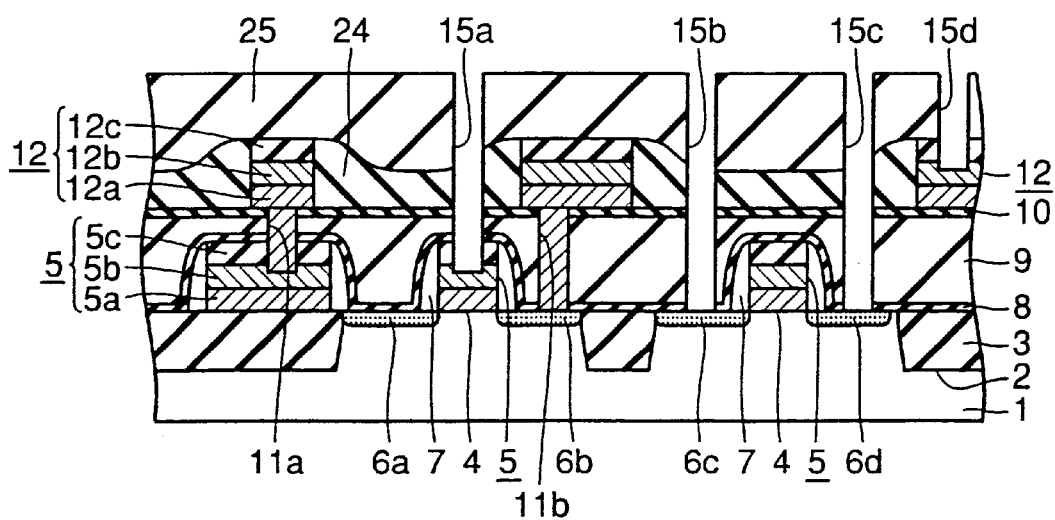
FIG. 24 is a cross sectional view showing a step performed after the step shown in FIG. 23 in the fifth embodiment.

Referring to FIG. 24, silicon oxide film 25 is polished by the CMP method. Thus, the surface of silicon oxide film 25 is planarized over the entire wafer surface. Then, contact holes 15a, 15b, 15c, 15d are formed by the prescribed photolithography and RIE methods. Plugs, for example, of tungsten are filled in contact holes 15a, 15b, 15c, 15d and the third interconnection layer is formed on silicon oxide film 25 to complete the semiconductor device shown in FIG. 22.

Especially, the following effects are attained in the above described semiconductor device. Second interconnection layer 12 is fixed more strongly on silicon oxide film 10 by SOG film 24. Thus, displacement of silicon interconnection layer 12 can be suppressed effectively. Since the roughness of the wafer surface is eased by SOG film 24, the roughness of the surface of silicon oxide film 25 formed on SOG film 24 is eased. Accordingly, variation in the degree of polishing can be suppressed in polishing silicon oxide film 25 by the CMP method. Although silicon oxide film 25 is formed on SOG film 24, a PSG film may be formed instead.

Sixth Embodiment

Figure 25:
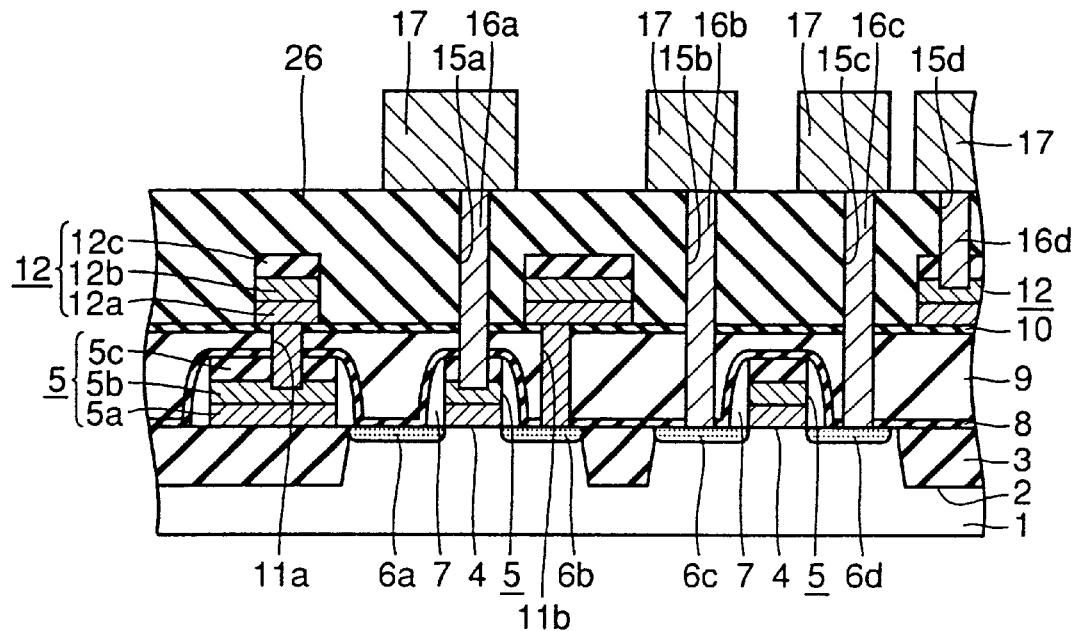
FIG. 25 is a cross sectional view showing a semiconductor device according to a sixth embodiment of the present invention.
Figure 26:
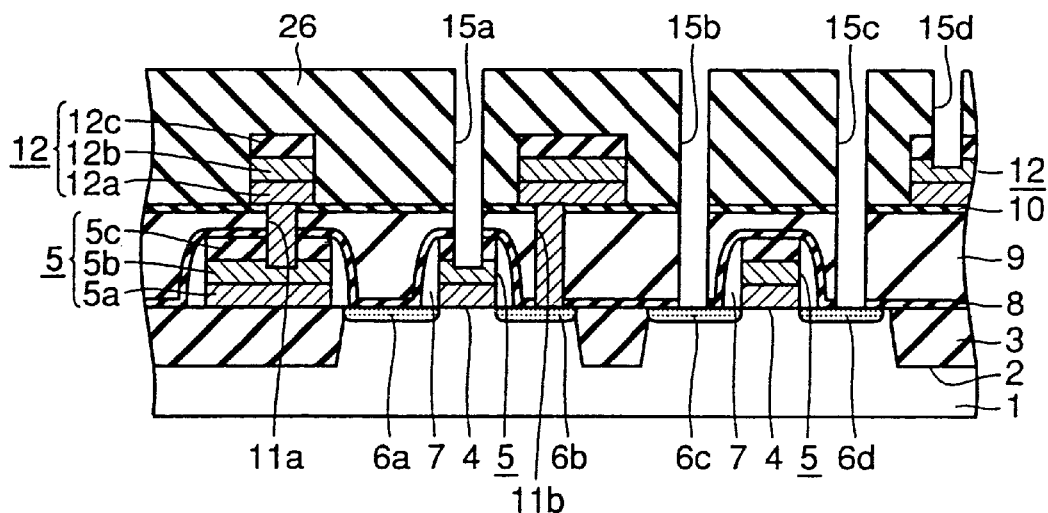
FIG. 26 is a cross sectional view showing one step of the method of manufacturing the semiconductor device shown in FIG. 25 in the sixth embodiment.

A semiconductor device according to a sixth embodiment will be described with reference to the drawings. Referring to FIG. 25, an SOG film 26 is formed on silicon oxide film 10 to cover second interconnection layer 12. SOG film 26 is polished by the CMP method. Third interconnection layer 17 is formed on SOG film 26. Since other parts are similar to the configuration of the semiconductor device shown in FIG. 1 described in the first embodiment, the same elements have the same reference characters and their description will not be repeated.

One example of the method of manufacturing the above described semiconductor device will be described in the following with reference to the drawing. Steps before formation of second interconnection layer 12 on silicon oxide film 10 are similar to the steps shown in FIGS. 2 to 5 described in the first embodiment. To cover second interconnection layer 12, comparatively thick SOG film 26 is then formed on silicon oxide film 10. SOG film 26 is polished by the CMP method Thereafter, contact holes 15a, 15b, 15c, 15d are formed by the prescribed photolithography and RIE methods. Plugs, for example, of tungsten are filled in contact holes 15a, 15b, 15c, 15d and the third interconnection layer is formed on SOG film 26 to complete the semiconductor device shown in FIG. 25.

Especially, the following effects are attained in the above described semiconductor device. Second interconnection layer 12 is fixed strongly on silicon oxide film 10 by comparatively thick SOG film 26. Therefore, BPSG film 9 is planarized over the entire wafer surface and displacement of second interconnection layer 12 can be further suppressed. Since SOG film 26 is polished and planarized over the entire wafer surface, third interconnection layer 17 with high dimensional precision can be formed more easily.

Seventh Embodiment

Figure 27:
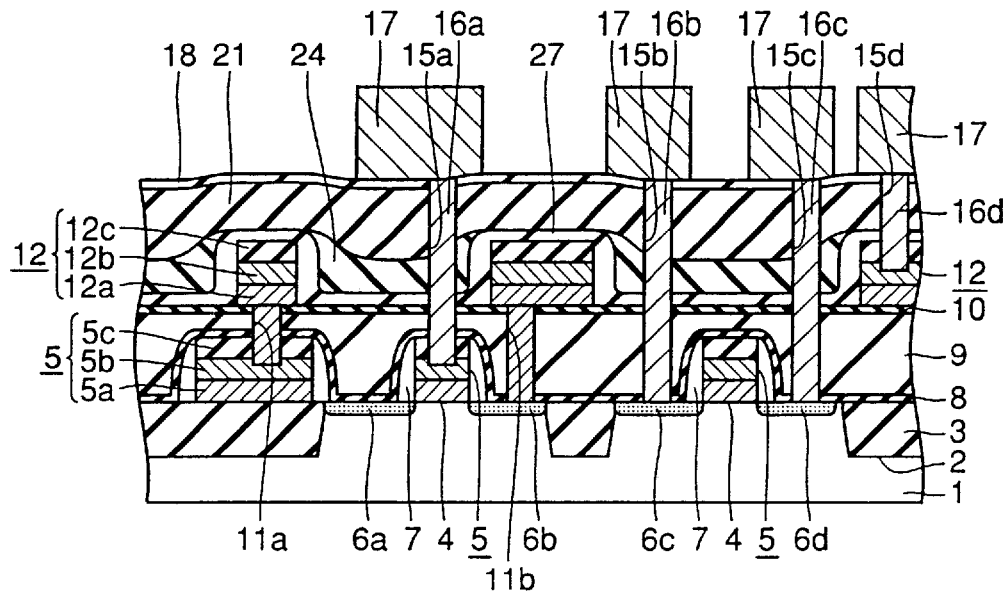
FIG. 27 is a cross sectional view showing a semiconductor device according to a seventh embodiment of the present invention.

A semiconductor device according to a seventh embodiment will be described with reference to the drawings. Referring to FIG. 27, a comparatively thin silicon oxide film 27 is formed on silicon oxide film 10 to cover second interconnection layer 12. SOG film 24 is formed on silicon oxide film 27. BPSG film 21 is formed on SOG film 24. BPSG film 21 is reflowed by heating. Silicon oxide film 18 is formed on reflowed BPSG film 21. Third interconnection layer 17 is formed on silicon oxide film 18. Since other parts are similar to the configuration of the semiconductor device shown in FIG. 1 described in the first embodiment, the same elements have the same reference characters and their description will not be repeated.

Figure 28:
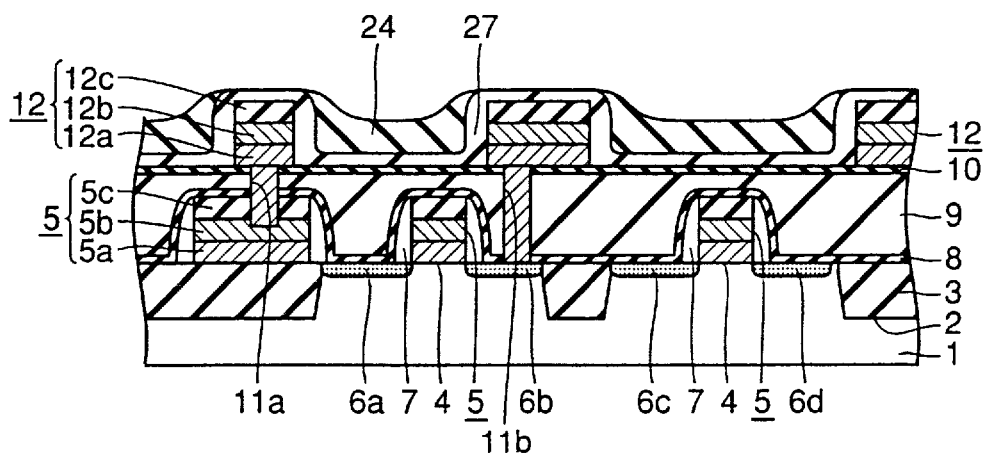
FIG. 28 is a cross sectional view showing one step of the method of manufacturing the semiconductor device shown in FIG. 27 in the seventh embodiment.

A method of manufacturing the above described semiconductor device will be described in the following with reference to the drawing. Referring to FIG. 28, second interconnection layer 12 is formed on silicon oxide film 10, and comparatively thin silicon oxide film 27 is then formed on silicon oxide film 10 by the CVD method to cover second interconnection layer 12. SOG film 24 is formed on silicon oxide film 27. Thereafter, steps similar to the steps shown in FIG. 21 described in the fourth embodiment are performed to complete the semiconductor device shown in FIG. 27.

Especially, the following effects are attained in the above described semiconductor device. Silicon oxide film 27 is formed to cover second interconnection layer 12. Thus, in addition to the effect of further suppressing displacement of second interconnection layer 12 described in the fourth embodiment, diffusion of an impurity such as hydrogen contained in SOG film 24 to second interconnection layer 12 and the like can be prevented.

Although silicon oxide film 27 is applied, as a film for protecting second interconnection layer 12, to the semiconductor device shown in FIG. 19 in this embodiment, the similar effects can be attained even if the film is applied to the semiconductor devices shown in FIGS. 22 and 25.

Eighth Embodiment

Figure 29:
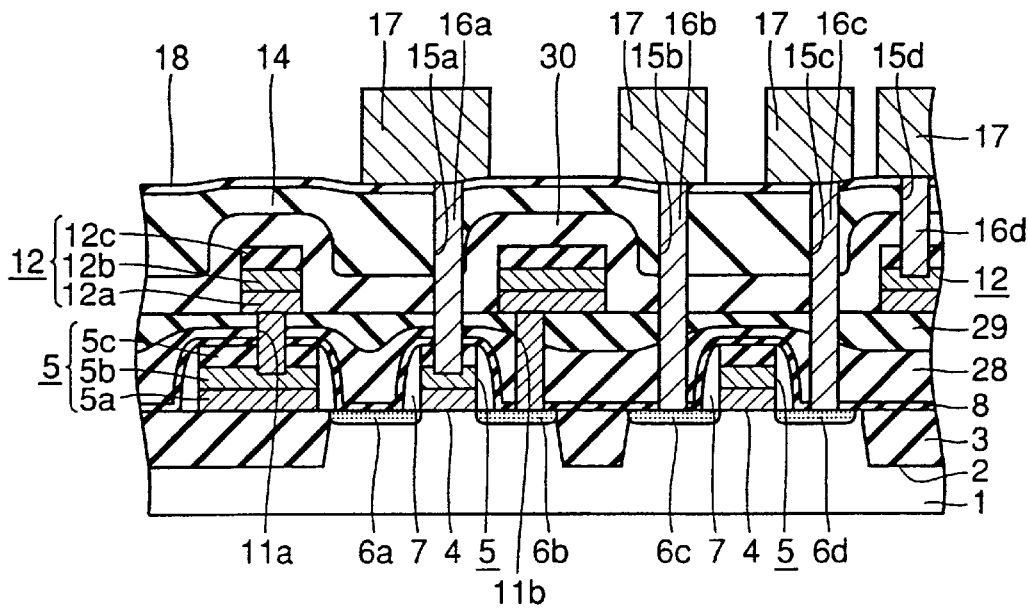
FIG. 29 is a cross sectional view showing a semiconductor device according to an eighth embodiment of the present invention.

A semiconductor device according to an eighth embodiment will be described with reference to the drawings. Referring to FIG. 29, a BPSG film 28 is formed on silicon oxide film 8. BPSG film 28 is reflowed by heating. A silicon oxide film 29 is formed on reflowed BPSG film 28. Silicon oxide film 29 is polished by the CMP method. Second interconnection layer 12 is formed on silicon oxide film 29. A silicon oxide film 30 is formed on silicon oxide film 29 to cover second interconnection layer 12. BPSG film 14 is formed on silicon oxide film 30. BPSG film 14 is reflowed by heating. Silicon oxide film 18 is formed on reflowed BPSG film 14. Third interconnection layer 17 is formed on silicon oxide film 18. Since other parts are similar to the configuration of the semiconductor device shown in FIG. 1 described in the first embodiment, the same elements have the same reference characters and their description will not be repeated.

Figure 30:
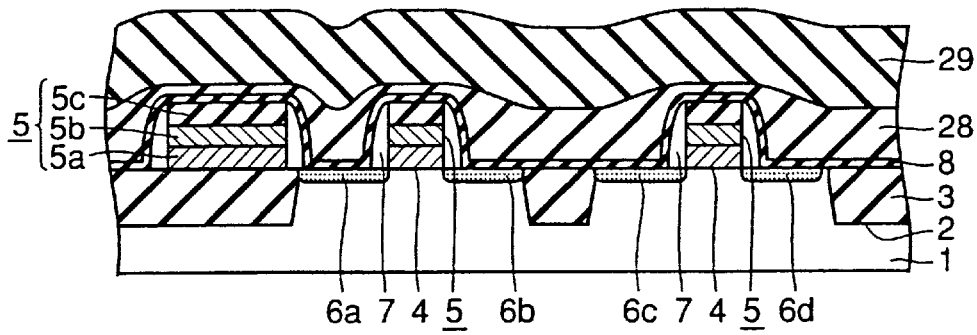
FIG. 30 is a cross sectional view showing one step of the method of manufacturing the semiconductor device shown in FIG. 29 in the eighth embodiment.

A method of manufacturing the above described semiconductor device will be described in the following with reference to the drawings. Referring to FIG. 30, steps before formation of silicon oxide films 8 are similar to the steps shown in FIGS. 2 and 3 described in the first embodiment. Then, BPSG film 28 having a film thickness of approximately 300 nm is formed on silicon oxide film 8 by the CVD method. BPSG film 28 is heated at a temperature of approximately 800° C. to reflow BPSG film 28. Silicon oxide film 29 having a film thickness of approximately 600 nm is formed on reflowed BPSG film 28 by the CVD method.

Figure 31:
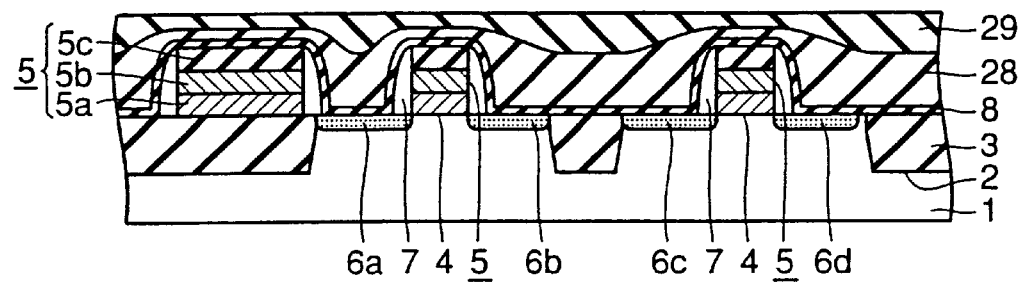
FIGS. 31 and 32 are cross sectional views respectively showing steps performed after the steps shown in FIGS. 30 and 31 in the eighth embodiment.

Referring to FIG. 31, silicon oxide film 29 is polished by the CMP method. Thus, the surface of silicon oxide film 29 is planarized over the entire wafer surface.

Figure 32:
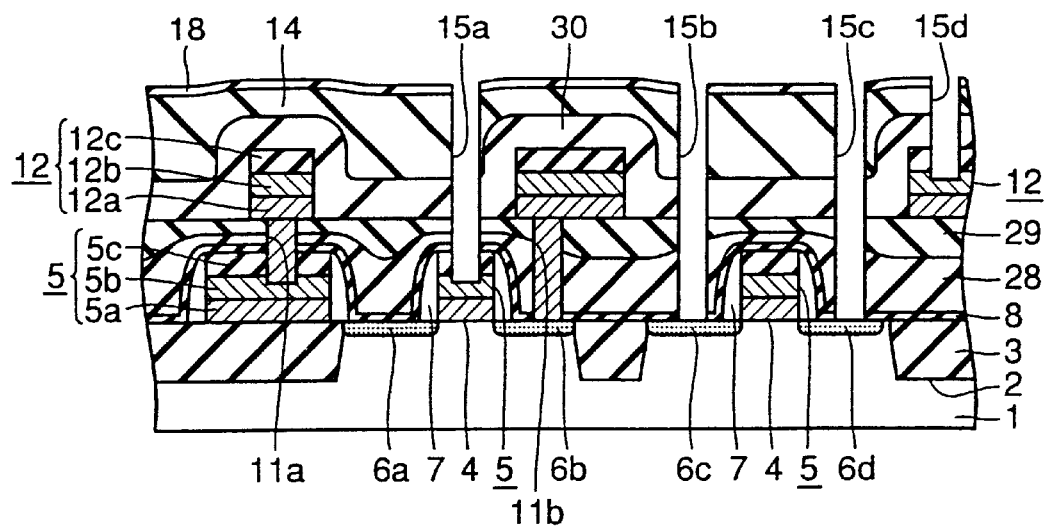

Referring to FIG. 32, second interconnection layer 12 is formed on silicon oxide film 29. Silicon oxide film 30 is formed on silicon oxide film 29 to cover second interconnection layer 12. Silicon oxide film 30 has a thickness of at least the substantial thickness of second interconnection layer 12. BPSG film 14 is formed on silicon oxide film 30 by the CVD method. BPSG film 14 is heated to reflow BPSG film 14. Silicon oxide film 18 is formed on reflowed BPSG film 14 by the CVD method. Then, contact holes 15a, 15b, 15c, 15d are formed by the prescribed photolithography and RIE methods. Plugs, for example, of tungsten are filled in contact holes 15a, 15b, 15d, 15d and the third interconnection layer is formed on silicon oxide film 18 to complete the semiconductor device shown in FIG. 29.

Especially, the following effects are attained in the above described semiconductor device. Reflowed BPSG film 28 is fixed by silicon oxide film 29. Since silicon oxide film 29 is polished, silicon oxide film 29 is planarized over the entire wafer surface. Further, second interconnection layer 12 is fixed strongly on silicon oxide film 29 by silicon oxide film 30. Thus, even if BPSG film 28 is transformed when BPSG film 14 is reflowed by heating, displacement of second interconnection layer 12 can be suppressed more effectively.

Since silicon oxide film 29 is formed on reflowed BPSG film 28, the roughness of the surface is eased. Thus, variation in the degree of polishing silicon oxide film 29 can be reduced.

Even if a corresponding configuration of the semiconductor devices shown in FIGS. 10, 13, 16, 19, 22, 25, 27 is applied to the configuration above second interconnection layer 12 as a variation of this embodiment, the effect of suppressing displacement of second interconnection layer 12, the effect of obtaining interconnection layers with high dimensional precision, and the like can be attained.

Ninth Embodiment

Figure 33:
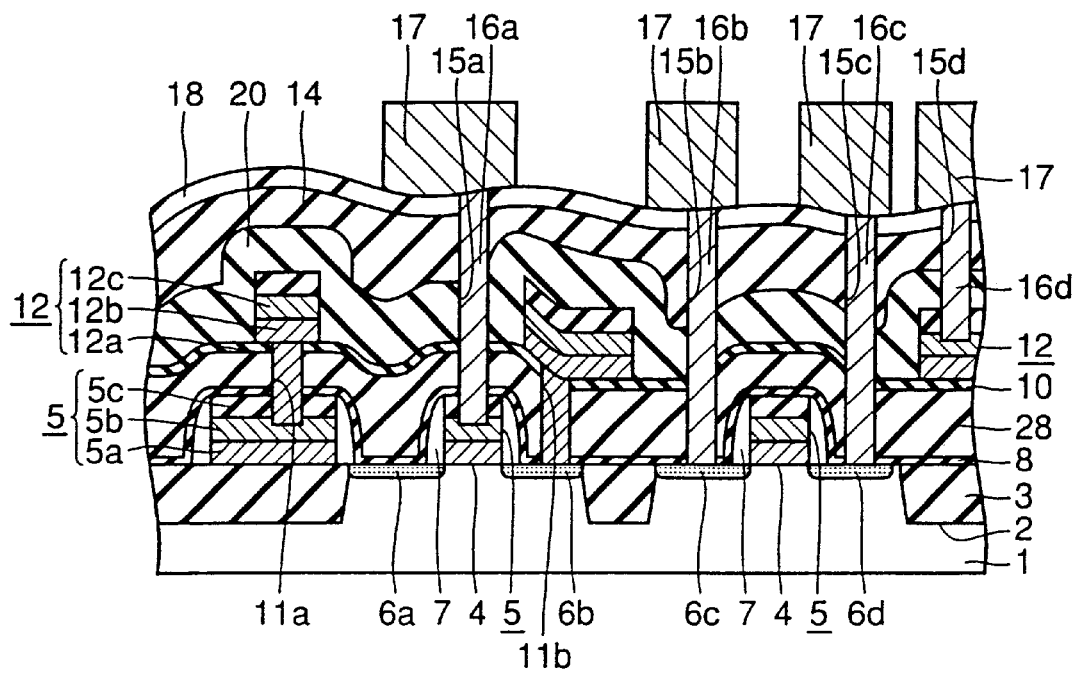
FIG. 33 is a cross sectional view showing a semiconductor device according to a ninth embodiment of the present invention.

A semiconductor device according to a ninth embodiment will be described with reference to the drawings. Referring to FIG. 33, BPSG film 28 is formed on silicon oxide film 8. BPSG film 28 is reflowed by heating. Silicon oxide film 10 is formed on reflowed BPSG film 28. Second interconnection layer 12 is formed on silicon oxide film 10. Silicon oxide film 20 is formed on silicon oxide film 10 to cover second interconnection layer 12. BPSG film 14 is formed on silicon oxide film 20. BPSG film 14 is reflowed by heating. Silicon oxide film 18 is formed on reflowed BPSG film 14. Third interconnection layer 17 is formed on silicon oxide film 18. Since other parts are similar to the configuration of the semiconductor device shown in FIG. 1 described in the first embodiment, the same elements have the same reference characters and their description will not be repeated. Especially, the semiconductor device according to this embodiment is similar to the configuration of the semiconductor device shown in FIG. 1 described in the first embodiment without polishing by the CMP method for BPSG film 9.

Figure 34:
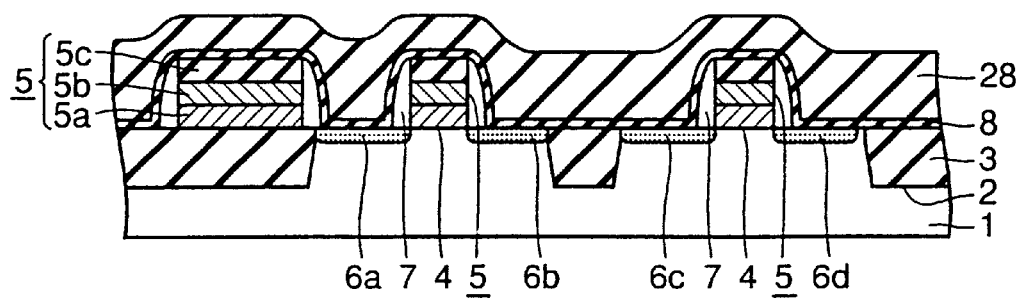
FIG. 34 is a cross sectional view showing one step of the method of manufacturing the semiconductor device shown in FIG. 33 in the ninth embodiment.

A method of manufacturing the above described semiconductor device will be described in the following with reference to the drawings. Referring to FIG. 34, steps before formation of silicon oxide film 8 are similar to the steps shown in FIG. 2 described in the first embodiment. BPSG film 28 having a film thickness of approximately 600 nm is formed on silicon oxide film 8 by the CVD method. BPSG film 28 is heated at a temperature of 800° C. to reflow BPSG film 28.

Figure 35:
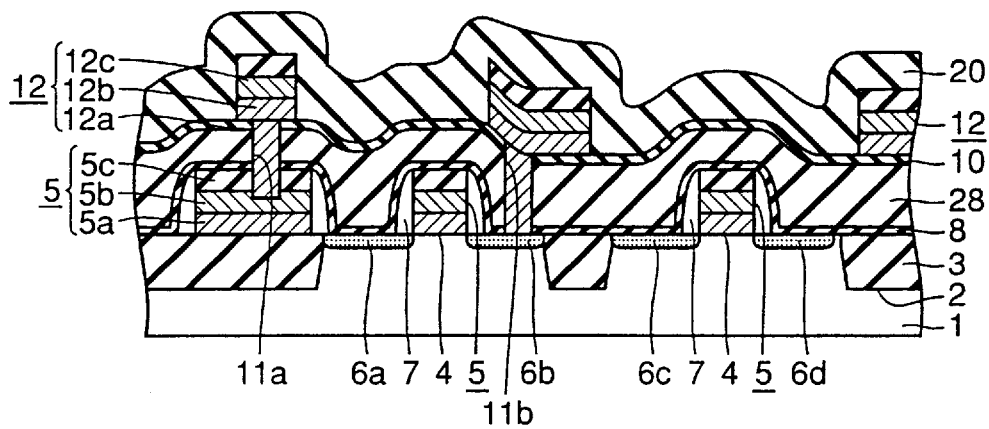
FIGS. 35 and 36 are cross sectional views respectively showing steps performed after the steps shown in FIGS. 34 and 35 in the ninth embodiment.

Referring to FIG. 35, silicon oxide film 10 having a film thickness of 100 nm is formed on reflowed BPSG film 28 by the CVD method. Second interconnection layer 12 is formed on silicon oxide film 10. Silicon oxide film 20 is formed on silicon oxide film 10 by the CVD method to cover second interconnection layer 12. Silicon oxide film 20 has a thickness of at least the substantial thickness of second interconnection layer 12.

Figure 36:
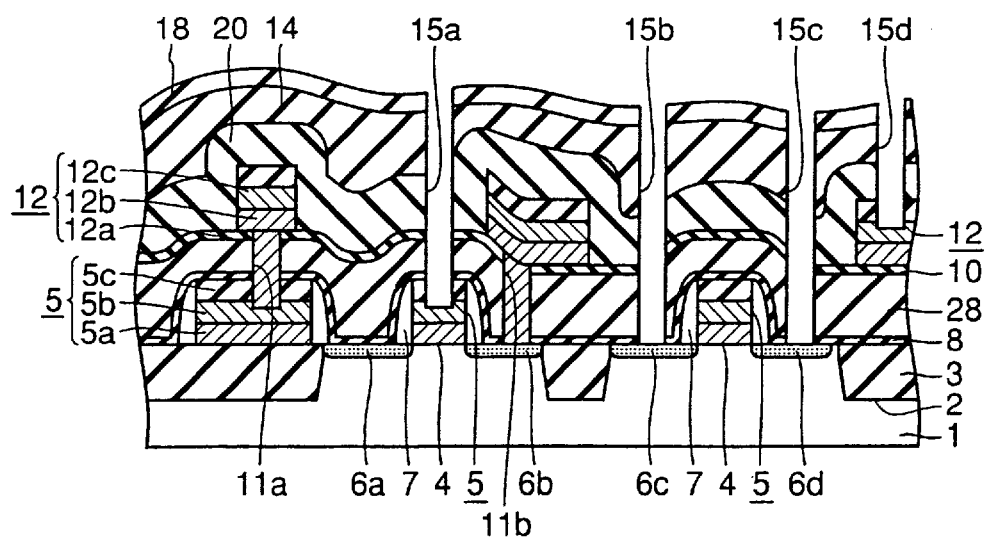

Referring to FIG. 36, BPSG film 14 having a film thickness of approximately 1000 nm is formed on silicon oxide film 20 by the CVD method. BPSG film 14 is heated to reflow BPSG film 14. At this time, the planarity of BPSG film 14 may be improved by etching reflowed BPSG film 14 by the RIE method or a hydrofluoric acid solution. The planarity may also be ensured by polishing reflowed BPSG film 14 by the CMP method. Then, silicon oxide film 18 is formed on BPSG film 14 by the CVD method. Contact holes 15a, 15b, 15c, 15d are formed by the prescribed photolithography and RIE methods. Contact holes 15a, 15b, 15c, 15d are filled with plugs, for example, of tungsten and the third interconnection layer is formed on silicon oxide film 18 to complete the semiconductor device shown in FIG. 33.

Especially, the following effects are attained in the above described semiconductor device. Second interconnection layer 12 is fixed strongly on silicon oxide film 10 by silicon oxide film 20. Thus, even if BPSG film 28 is transformed by the heating for reflowing BPSG film 14, displacement of second interconnection layer 12 can be suppressed.

Even if a corresponding configuration of the semiconductor devices shown in FIGS. 10, 13, 16, 19, 22, 25, 27 is applied to the configuration above second interconnection layer 12 as a variation of the semiconductor device according to this embodiment, the effect of suppressing displacement of second interconnection layer 12, the effect of forming interconnection layers with high dimensional precision, and the like can be attained.

Tenth Embodiment

Figure 37:
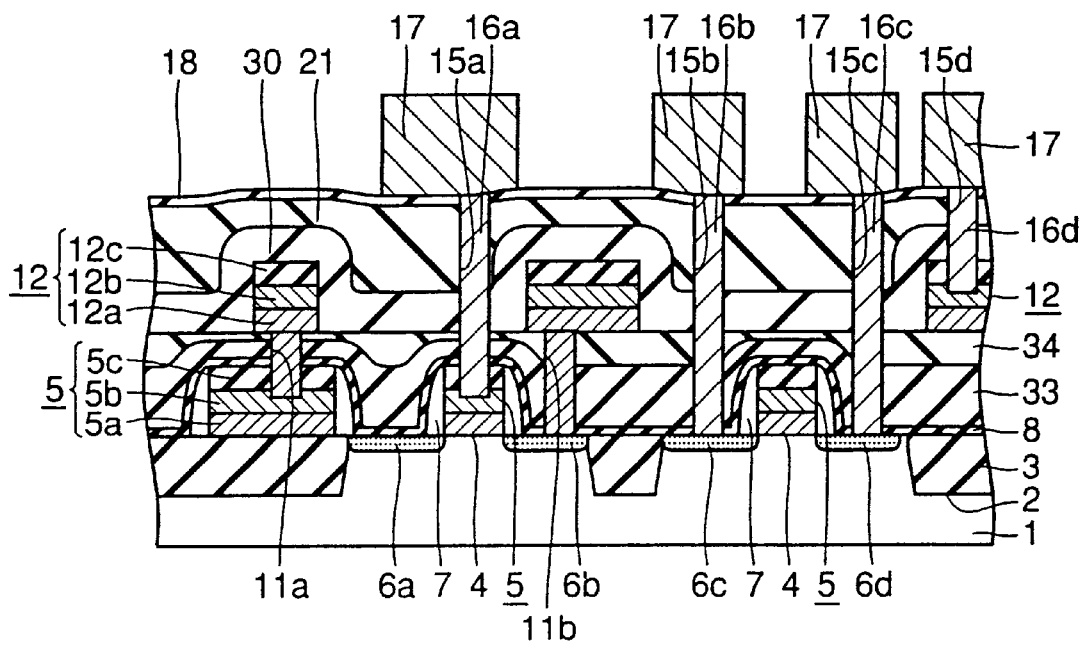
FIG. 37 is a cross sectional view showing a semiconductor device according to a tenth embodiment of the present invention.

A semiconductor device according to a tenth embodiment will be described with reference to the drawings. Referring to FIG. 37, a PSG film 33 is formed on silicon oxide film 8. A silicon oxide film 34 is formed on PSG film 33. Silicon oxide film 34 is polished by the CMP method. Second interconnection layer 12 is formed on silicon oxide film 34. Silicon oxide film 30 is formed on silicon oxide film 34 to cover second interconnection layer 12. Silicon oxide film 30 has a thickness of at least the substantial thickness of second interconnection layer 12. BPSG film 21 is formed on silicon oxide film 30. BPSG film 21 is reflowed by heating. Silicon oxide film 18 is formed on BPSG film 21. Third interconnection layer 17 is formed on silicon oxide film 18. Since other parts are similar to the configuration of the semiconductor device shown in FIG. 1 described in the first embodiment, the same elements have the same reference characters and their description will not be repeated.

Figure 38:
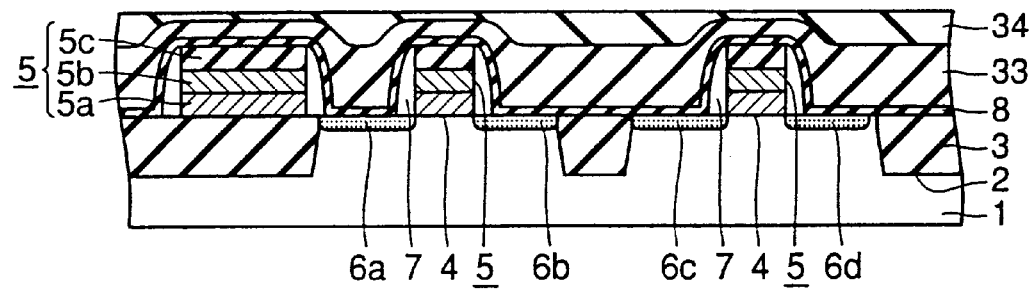
FIG. 38 is a cross sectional view showing one step of the method of manufacturing the semiconductor device shown in FIG. 37 in the tenth embodiment.

A method of manufacturing the above described semiconductor device will be described in the following with reference to the drawings. Referring to FIG. 38, steps before formation of silicon oxide film 8 are similar to the steps shown in FIG. 2 described in the first embodiment. Then, PSG film 33 having a film thickness of approximately 600 nm is formed on silicon oxide film 8 by the CVD method. A comparatively thick silicon oxide film (not shown) is formed on PSG film 33. The silicon oxide film is polished by the CMP method. Thus, silicon oxide film 34 is planarized over the entire wafer surface.

Figure 39:
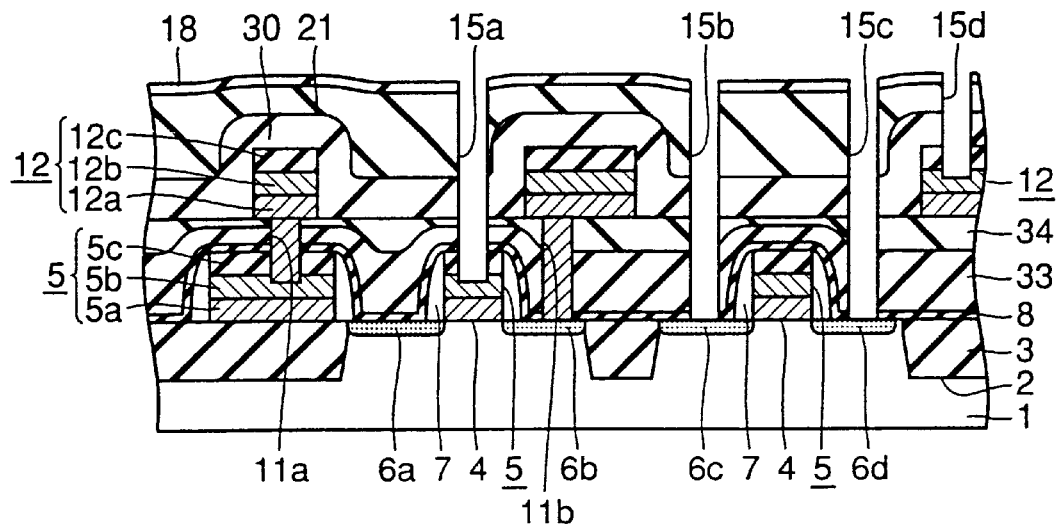
FIG. 39 is a cross sectional view showing a step performed after the step shown in FIG. 38 in the tenth embodiment.

Referring to FIG. 39, second interconnection layer 12 is formed on silicon oxide film 34. Silicon oxide film 30 is formed on silicon oxide film 34 by the CVD method to cover second interconnection layer 12. BPSG film 21 is formed on silicon oxide film 30 by the CVD method. BPSG film 21 is heated at a temperature of approximately 800° C. to reflow BPSG film 21. Then, reflowed BPSG film 21 may be further planarized, if necessary, by etching BPSG film 21 by the RIE method or a hydrofluoric acid solution. The reflowed BPSG film 21 may also be polished by the CMP method. Silicon oxide film 18 having a film thickness of approximately 100 nm is formed on BPSG film 21 by the CVD method. Then, contact holes 15a, 15b, 15c, 15d are formed by the prescribed photolithography and RIE methods. Contact holes 15a, 15b, 15c, 15d are filled with plugs, for example, of tungsten and the third interconnection layer is formed on silicon oxide film 18 to complete the semiconductor device shown in FIG. 37.

Especially, the following effects are attained in the above described semiconductor device. Below second interconnection layer 12, PSG film 33 and silicon oxide film 34 and the like are formed and a BPSG film is not formed. Thus, even if BPSG film 21 is heated to be reflowed, PSG film 33, silicon oxide film 34 and the like are not transformed and displacement of second interconnection layer 12 can easily be prevented.

Even if a corresponding configuration of the semiconductor devices shown in FIGS. 10, 13, 16, 19, 22, 25, 27 is applied to the configuration above second interconnection layer 12 as a variation of the semiconductor device of this embodiment, similar effects are attained.

Eleventh Embodiment

Figure 40:
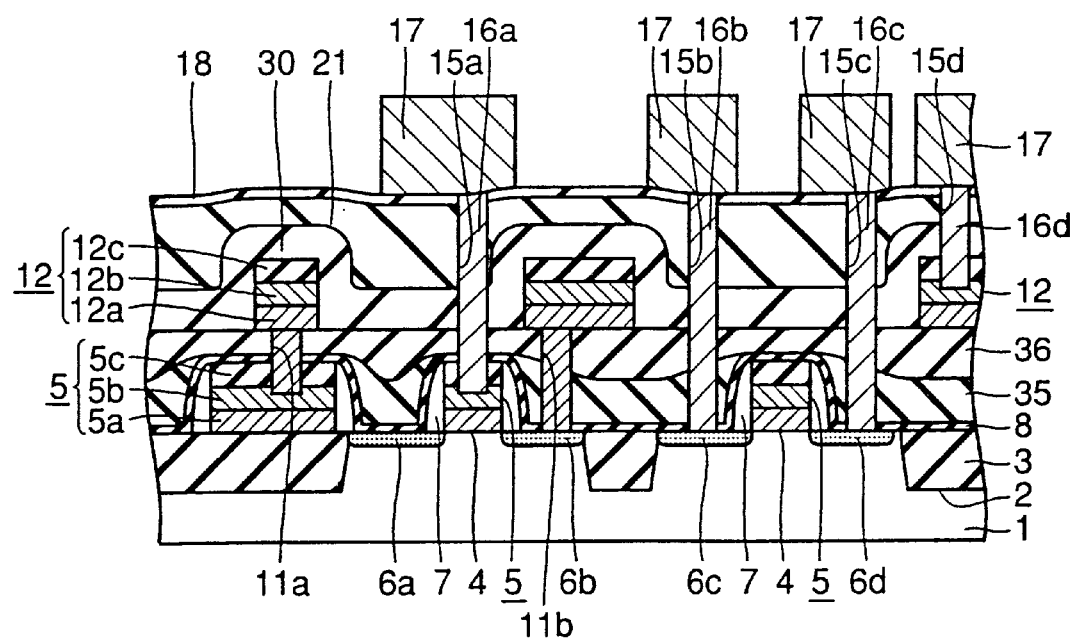
FIG. 40 is a cross sectional view showing a semiconductor device according to an eleventh embodiment of the present invention.

A semiconductor device according to an eleventh embodiment will be described with reference to the drawings. Referring to FIG. 40, an SOG film 35 is formed on silicon oxide film 8. A silicon oxide film 36 is formed on SOG film 35. Silicon oxide film 36 is polished by the CMP method. Since other parts are similar to the semiconductor device shown in FIG. 37 described in the tenth embodiment, the same elements have the same reference characters and their description will not be repeated.

Figure 41:
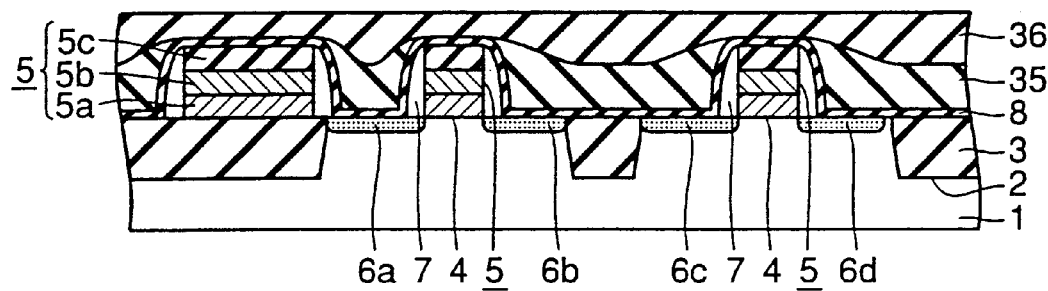
FIG. 41 is a cross sectional view showing one step of the method of manufacturing the semiconductor device shown in FIG. 40 in the eleventh embodiment.

A method of manufacturing the above described semiconductor device will be described in the following with reference to the drawings. Referring to FIG. 41, steps before formation of silicon oxide film 8 are similar to the steps shown in FIG. 2 described in the first embodiment. SOG film 35 having a film thickness of approximately 600 nm is formed on silicon oxide film 8. A comparatively thick silicon oxide film (not shown) is formed on SOG film 35 by the CVD method. The silicon oxide film is polished by the CMP method to form silicon oxide film 36. Thus, silicon oxide film 36 is planarized over the entire wafer surface.

Figure 42:
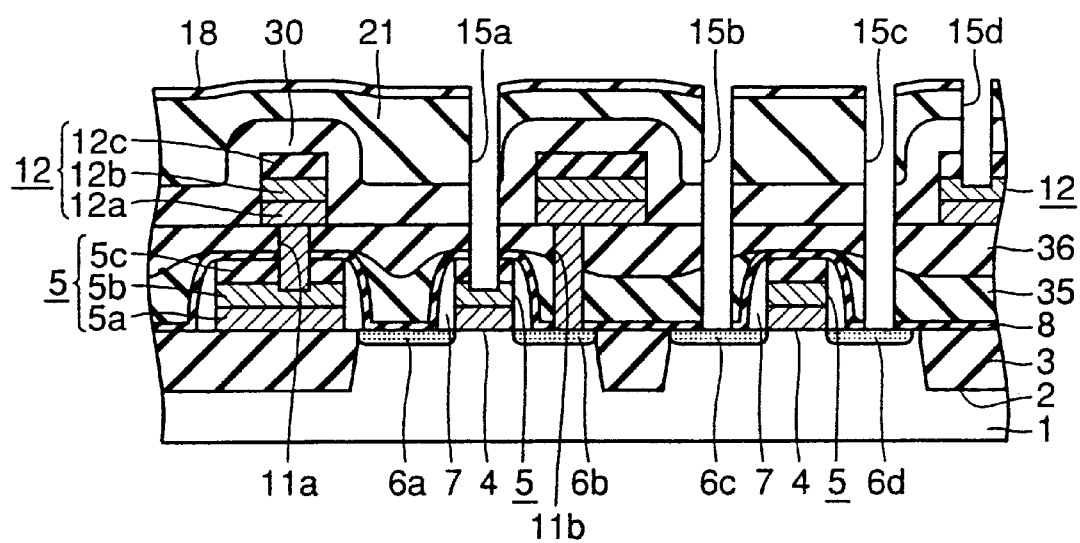
FIG. 42 is a cross sectional view showing one step of the method of manufacturing the semiconductor device shown in FIG. 41 in the eleventh embodiment.

Referring to FIG. 42, second interconnection layer 12 is formed on silicon oxide film 36. Silicon oxide film 30 is formed on silicon oxide film 36 to cover second interconnection layer 12. BPSG film 21 is formed on silicon oxide film 30 by the CVD method. BPSG film 21 is heated to reflow BPSG film 21. Silicon oxide film 18 is formed on reflowed BPSG film 21 by the CVD method. Contact holes 15a, 15b, 15c, 15d are formed by the prescribed photolithography and RIE methods. Contact holes 15a, 15b, 15c, 15d are filled with plugs, for example, of tungsten and the third interconnection layer is formed on silicon oxide film 18 to complete the semiconductor device shown in FIG. 40.

Especially, the following effects are attained in the above described semiconductor device. Below second interconnection layer 12, silicon oxide film 36, SOG film 35 and the like are formed and a BPSG film is not formed. Even if BPSG film 21 is heated to be reflowed, therefore, silicon oxide film 36, SOG film 35 and the like are not transformed. Thus, displacement of second interconnection layer 12 can easily be prevented.

Further, silicon oxide film 36 is formed on SOG film 35. Therefore, the roughness of surface of the silicon oxide film 36 before it is polished is eased. Thus, variation in the degree of polishing in polishing silicon oxide film 36 can be reduced.

Even if a corresponding configuration of the semiconductor devices shown in FIGS. 10, 13, 16, 19, 22, 25, 27 is applied to the configuration above second interconnection layer 12 as a variation of the semiconductor device of this embodiment, similar effects are attained.

Twelfth Embodiment

Figure 43:
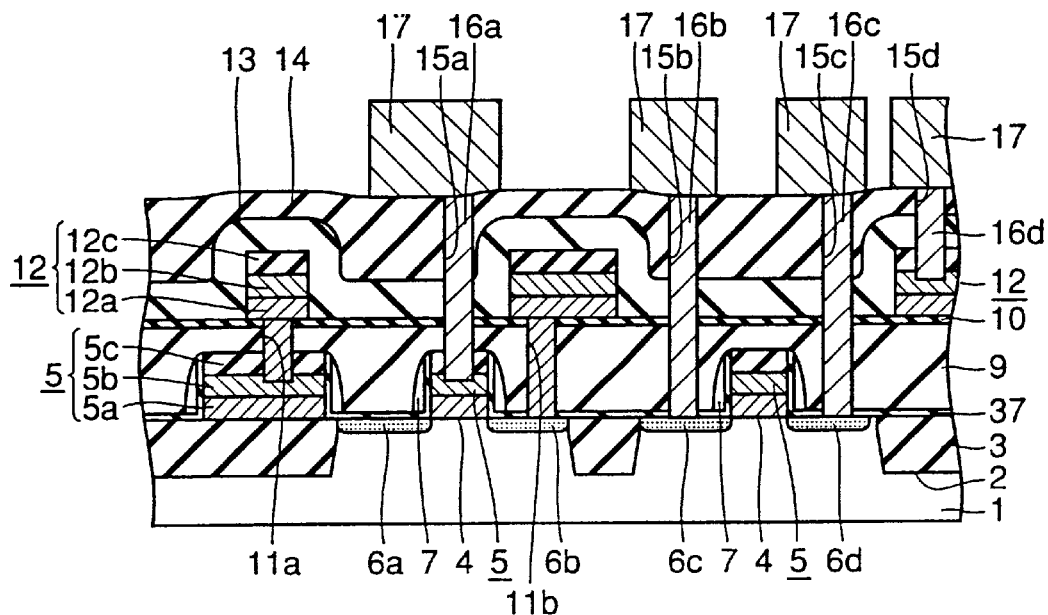
FIG. 43 is a cross sectional view showing a semiconductor device according to a twelfth embodiment of the present invention.

A semiconductor device according to a twelfth embodiment will be described with reference to the drawings. Referring to FIG. 43, a silicon oxide film 37 is formed on the surface of silicon semiconductor substrate 1 and on the both side surfaces of gate electrode potion 5. Sidewall insulating film 7 is formed on silicon oxide film 37 that is formed on the both side surfaces of gate electrode portion 5. Since other parts are similar to the configuration of the semiconductor device shown in FIG. 1 described in the first embodiment, the same elements have the same reference characters and their description will not be repeated.

Figure 44:
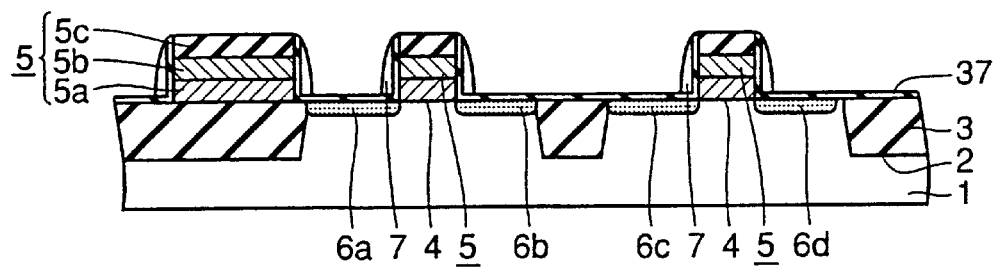
FIG. 44 is a cross sectional view showing one step of the method of manufacturing the semiconductor device shown in FIG. 43 in the twelfth embodiment.

A method of manufacturing the above described semiconductor device will be described in the following with reference to the drawing. Referring to FIG. 44, gate electrode portion 5 and impurity diffusion layers 6a, 6b, 6c, 6d are formed on and in silicon semiconductor substrate 1 in a similar manner to the steps shown in FIG. 2 described in the first embodiment. Then, silicon oxide film 37 is formed on the both side surfaces of gate electrode portion 5 and on impurity diffusion layers 6a, 6b, 6c, 6d by the thermal oxidation method. A silicon oxide film (not shown) having a film thickness of 10 to 50 nm is formed on silicon oxide film 37 by the CVD method. The silicon oxide film is etched by the RIE method to form sidewall insulating film 7. Then, the steps shown in FIGS. 2 to 8 described in the first embodiment are performed to complete the semiconductor device shown in FIG. 43.

According to the above described semiconductor device, in addition to the effects described in the first embodiment, diffusion of boron or phosphorous contained in BPSG film 9 to silicon semiconductor substrate 1 can be prevented by silicon oxide film 37. Thus, variation in the impurity concentration of impurity diffusion layers 6a, 6b, 6c, 6d can be suppressed, for example.

Meanwhile, when contact holes 11b, 15b, 15c and the like are to be formed, the contact holes may be formed by the self align contact method so as not to etch gate electrode portion 5. In this case, a laminate structure of a silicon oxide film and a silicon nitride film is applied as an insulating film formed on the both side surfaces of gate electrode portion 5. In the case of the above described semiconductor device, the contact hole by the self align contact method can be formed by applying silicon oxide film 37 as the silicon oxide film and applying a silicon nitride film to sidewall insulating film 7.

A corresponding configuration of the semiconductor devices in the above described embodiments may be applied to the configuration above gate electrode portion 5 as a variation of the semiconductor device according to this embodiment.

Thirteenth Embodiment

Figure 45:
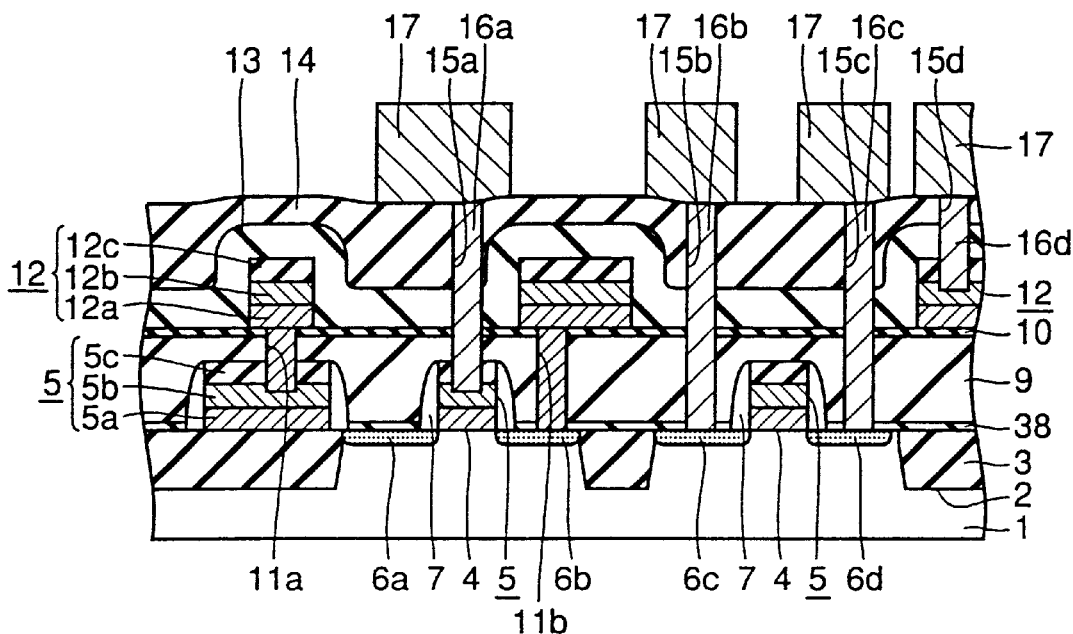
FIG. 45 is a cross sectional view showing a semiconductor device according to a thirteenth embodiment of the present invention.

A semiconductor device according to a thirteenth embodiment will be described with reference to the drawings. Referring to FIG. 45, a silicon oxide film 38 is formed on impurity diffusion layers 6a, 6b, 6c, 6d that are formed at silicon semiconductor substrate 1. BPSG film 9 is formed on silicon oxide film 38 and gate electrode portion 5. Since other parts are similar to the configuration of the semiconductor device shown in FIG. 1 described in the first embodiment, the same elements have the same reference characters and their description will not be repeated.

Figure 46:
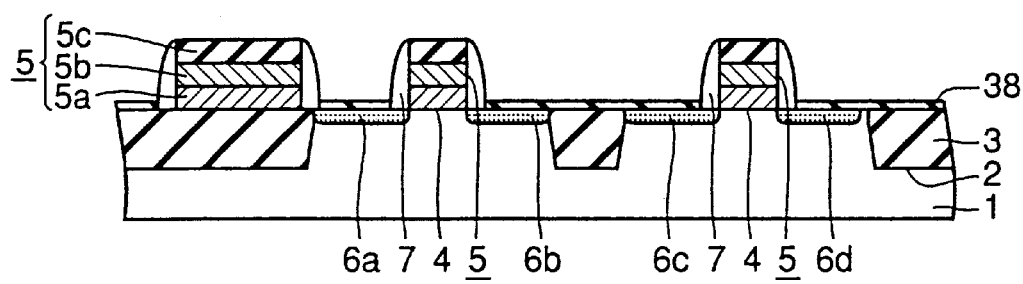
FIG. 46 is a cross sectional view showing one step of the method of manufacturing the semiconductor device shown in FIG. 45 in the thirteenth embodiment.
Figure 47:
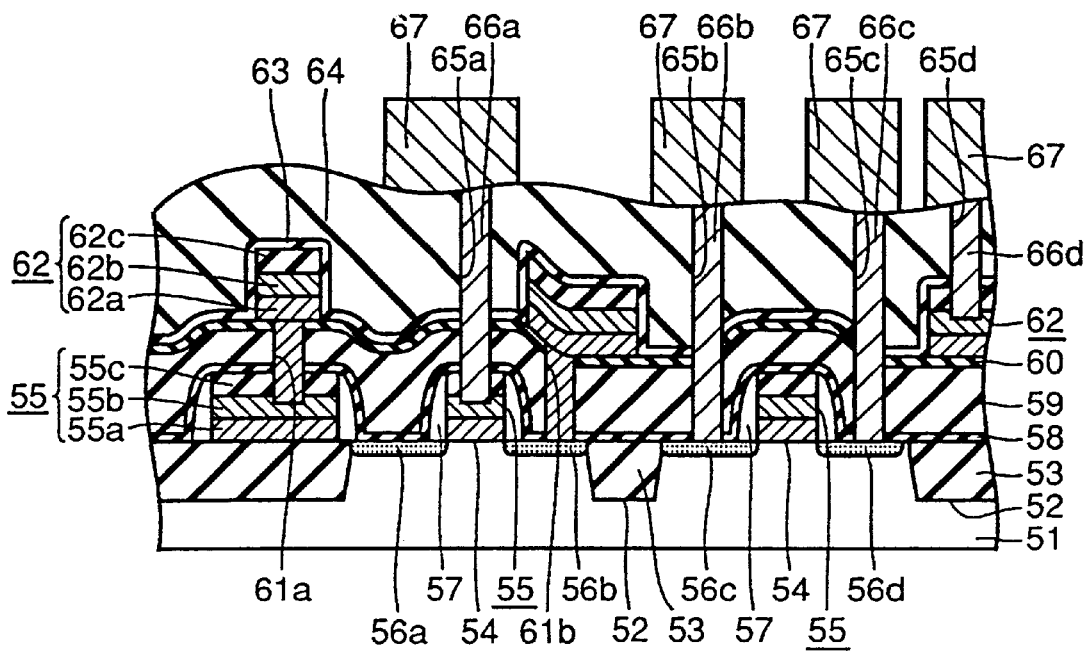
FIG. 47 is a cross sectional view showing a conventional semiconductor device.
Figure 48:
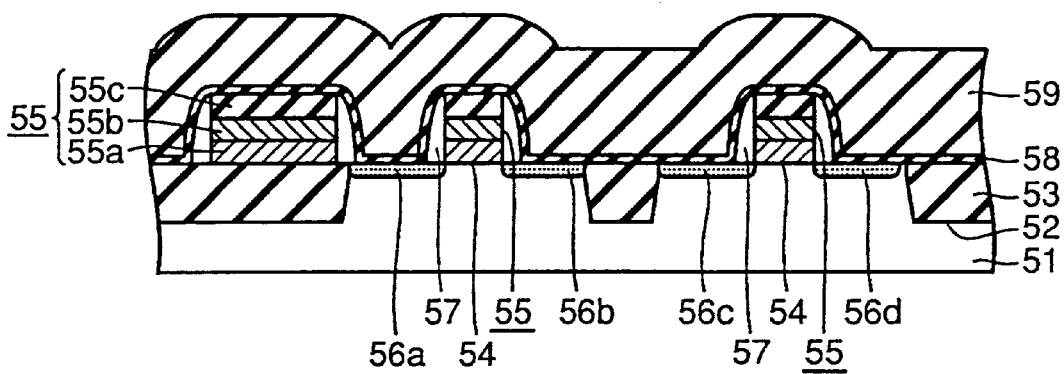
FIG. 48 is a cross sectional view showing one step of the method of manufacturing the semiconductor device shown in FIG. 47.
Figure 49:
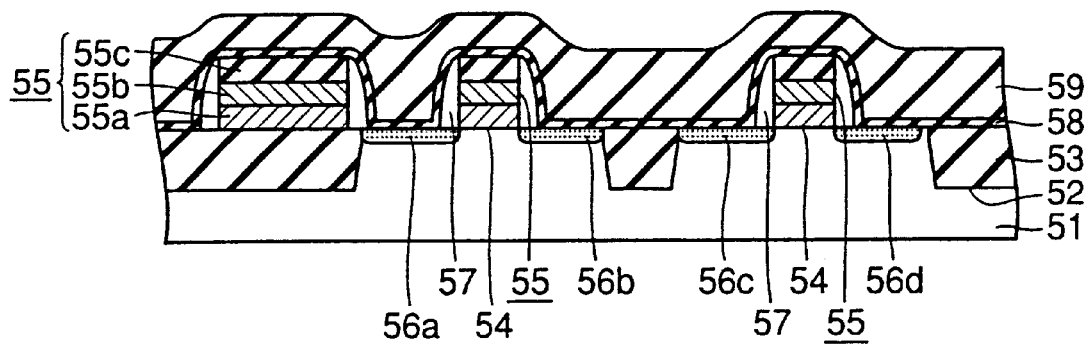
FIGS. 49 to 53 are cross sectional views respectively showing steps performed after the steps shown in FIGS. 48 to 52.
Figure 50:
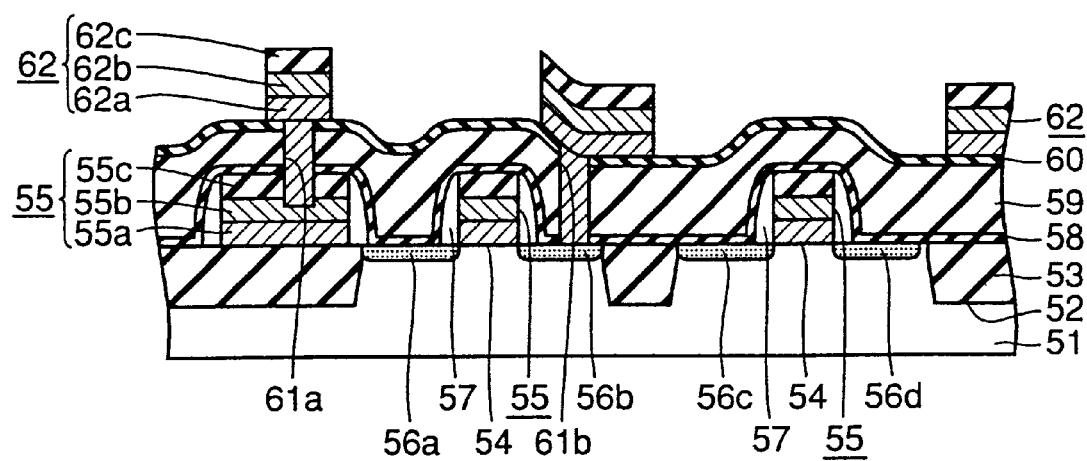
Figure 51:
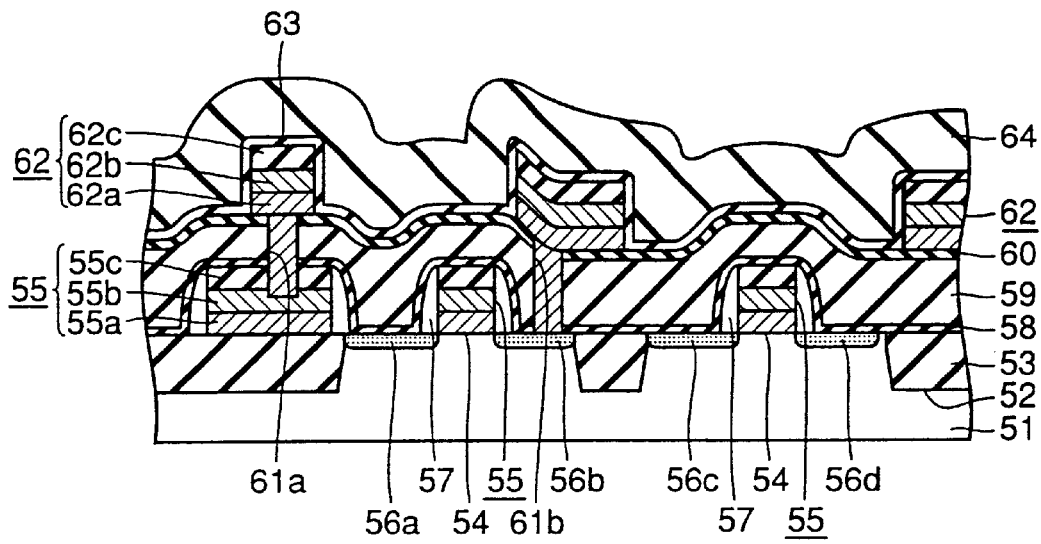
Figure 52:
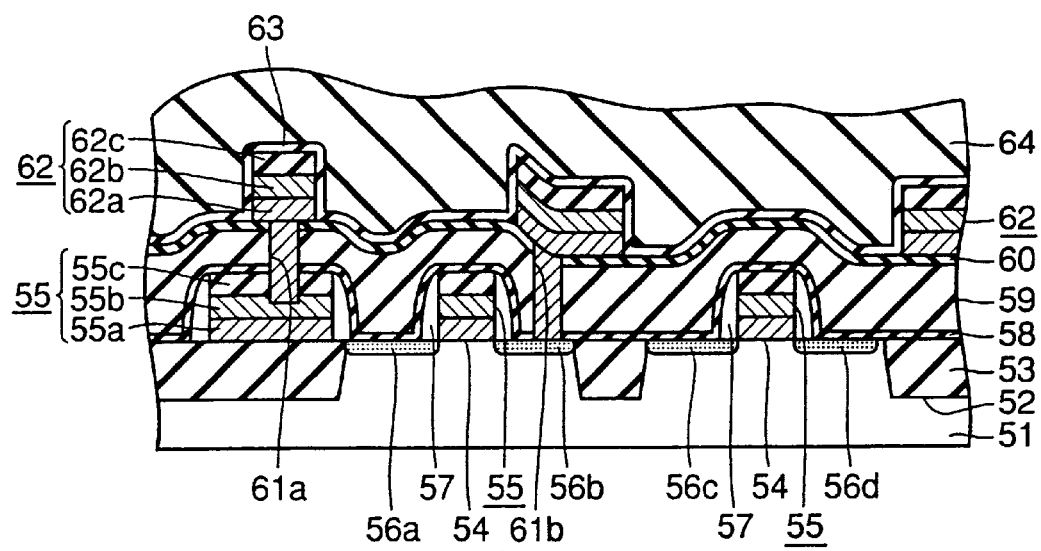
Figure 53:
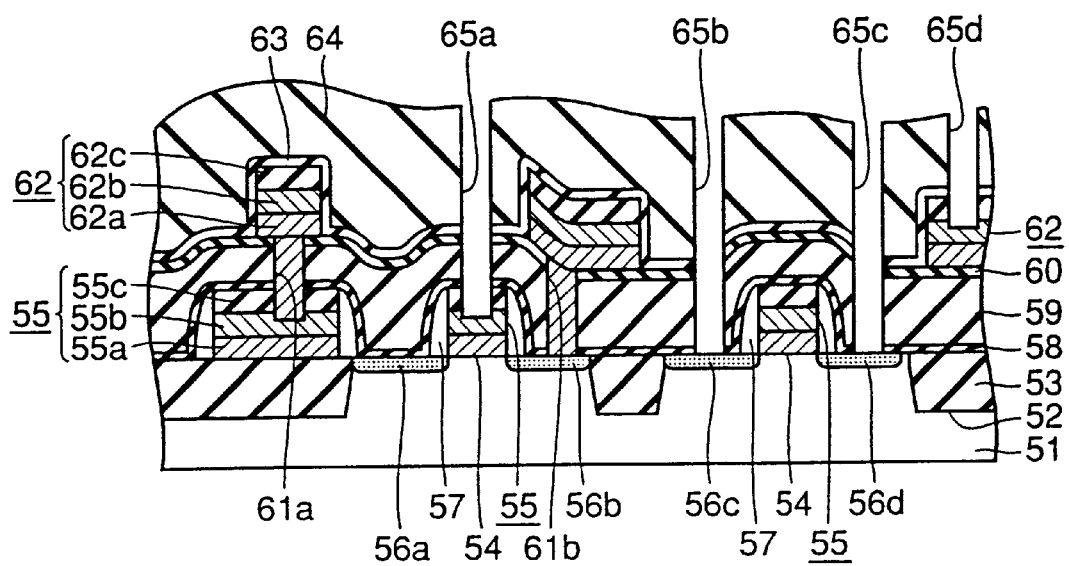

A method of manufacturing the above described semiconductor device will be described in the following with reference to the drawing. Referring to FIG. 46, gate electrode portion 5, sidewall insulating film 7 and impurity diffusion layers 6a, 6b, 6c, 6d are formed on and in silicon semiconductor substrate 1 in a similar manner to the steps shown in FIG. 2 described in the first embodiment. Then, silicon oxide film 38 is formed on impurity diffusion layers 6a, 6b, 6c, 6d by the thermal oxidation method. Thereafter, steps similar to the steps shown in FIGS. 2 to 8 described in the first embodiment are performed to complete the semiconductor device shown in FIG. 45.

According to the above described semiconductor device, in addition to the effects described in the first embodiment, diffusion of boron or phosphorous contained in BPSG film 9 to semiconductor substrate 1 can be prevented by silicon oxide film 38. Thus, variation in the impurity concentration of impurity diffusion layers 6a, 6b, 6c, 6d can be suppressed. When silicon oxide film 8 shown in FIG. 1 is further formed on silicon oxide film 38 to cover gate electrode portion 5 in the step shown in FIG. 46, diffusion of boron or phosphorous to silicon semiconductor substrate 1 can be prevented more effectively.

A corresponding configuration of the semiconductor devices in the above described embodiments may be applied to the configuration above gate electrode portion 5 as a variation of the semiconductor device according to this embodiment.

The method of forming the separating oxide films, the silicon oxide films, the silicon nitride films, the interconnection layers, the plugs and the like described in the embodiments above is one example, and they may be formed by other suitable methods. Although a polycrystalline silicon film and tungsten are exemplified as a material of the plugs, aluminum or copper may also be applied. Although the BPSG film is applied as a film for reflowing and planarizing a surface by heating, a silicon oxide film containing at least one species of impurities such as phosphorous, boron and arsenic can also be applied. The impurities are not limited to the ones mentioned above. Any impurities can be used if it lowers the temperature at which a silicon oxide film softens.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
    forming a first interconnection layer on a main surface of a semiconductor substrate;
    forming a first interlayer insulating film on said semiconductor substrate to cover said first interconnection layer;
    polishing said first interlayer by chemical-mechanical polishing to planarize a surface thereof;
    forming a second interconnection layer on said first interlayer insulating film;
    forming a second interlayer insulating film on said first interlayer insulating film to cover said second interconnection layer; and
    performing a thermal treatment on said second interlayer insulating film, wherein said first interlayer insulating film has a polished top surface, said polished top surface defining means for preventing displacement of said second interconnection layer when said first interlayer insulating film is transformed by heat.

2. The method of manufacturing the semiconductor device according to claim 1, wherein in said step of forming the first interlayer insulating film, said first interlayer insulating contains prescribed impurities and is reflowed.

3. A method of manufaturing a semiconductor device, comprising the steps of:
    forming a first interconnection layer on a main surface of a semiconductor substrate;
    forming a first interlayer insulating film on said semiconductor substrate to cover said first interconnection layer;

forming a coating insulating film covering said first interlayer insulating film;

planarizing a surface of said coating insulating film by chemical-mechanical polishing said coating insulating film;

forming a second interconnection layer on said first interlayer insulating film;

forming a second interlayer insulating film on said first interlayer insulating film to cover said second interconnection layer; and performing a thermal treatment on said second interlayer insulating film, wherein said first interlayer insulating film has a polished top surface, said polished top surface defining means for preventing displacement of said second interconnection layer when said first interlayer insulating film is transformed by heat.

4. The method of manufacturing the semiconductor device according to claim 3, wherein in said step of forming the coating insulating film, said coating insulating film contains prescribed impurities and is reflowed.

5. The method of manufacturing the semiconductor device according to claim 3, wherein said step of forming the coating insulating film includes the step of forming an impurity-non-doped film not containing prescribed impurities, and said step of planarizing the surface of the coating insulating film includes said step of chemically and mechanically polishing said impurity-non-doped insulating film.

6. A method of manufacturing a semiconductor device, comprising the steps of:

forming a first interconnection layer on main surface of a semiconductor substrate;

forming a first interlayer insulating film to cover said first interconnection layer; said first interlayer insulating film containing prescribed impurities for reflow;

forming a second interconnection layer on said first interlayer insulating film;

forming a second interlayer insulating film on said first interlayer insulating film to cover said second interconnection layer, said second interlayer insulating film having an interconnection coating insulating film that covers said second interconnection layer, said interconnection coating coating insulating film having a thickness capable of fixing and holding said second interconnection layer and covers said second interconnection layer; and peforming a thermal treatment on said second interlayer insulating film.

7. The method of manufacturing the semiconductor device according to claim 6, wherein in said step of forming the interconnection coating insulating film, said interconnection coating insulating film is formed to have a thickness of at least a thickness of said second interconnection layer.

* * * * *